US006268242B1

(12) United States Patent
Williams et al.

(10) Patent No.: US 6,268,242 B1
(45) Date of Patent: Jul. 31, 2001

(54) METHOD OF FORMING VERTICAL MOSFET DEVICE HAVING VOLTAGE CLAMPED GATE AND SELF-ALIGNED CONTACT

(76) Inventors: Richard K. Williams, 10292 Norwich Ave., Cupertino, CA (US) 95014; Wayne B. Grabowski, 1390 Miravalle Ave., Los Altos, CA (US) 94024

( * ) Notice: Subject to any disclaimer, the term of this patent is extended or adjusted under 35 U.S.C. 154(b) by 0 days.

(21) Appl. No.: 09/314,621

(22) Filed: May 19, 1999

Related U.S. Application Data

(63) Continuation-in-part of application No. 09/001,768, filed on Dec. 31, 1997.

(51) Int. Cl.$^7$ ............... H01L 21/8234; H01L 21/336; H01L 29/76; H01L 23/62
(52) U.S. Cl. ............... 438/237; 438/268; 438/257; 438/258; 257/331; 257/341; 257/355
(58) Field of Search ............... 438/237, 251, 438/258, 259, 260, 268, 289, 270, 299, 301, 302; 257/331, 341, 355

(56) References Cited

U.S. PATENT DOCUMENTS

| 3,967,295 | 6/1976 | Stewart ............... 357/51 |
| 4,751,408 | 6/1988 | Rambert ............... 307/571 |
| 4,757,363 | 7/1988 | Bohm et al. ............... 357/23.13 |
| 4,760,434 | 7/1988 | Tsuzuki et al. ............... 357/23.13 |
| 4,831,424 | 5/1989 | Yoshida et al. ............... 357/23.13 |
| 4,931,846 | * 6/1990 | Mihara ............... 357/23.4 |
| 5,119,162 | * 6/1992 | Todd et al. ............... 357/43 |
| 5,274,274 | 12/1993 | Leman et al. ............... 307/360 |
| 5,397,914 | 3/1995 | Suda et al. ............... 257/570 |
| 5,439,842 | * 8/1995 | Chang et al. ............... 437/70 |
| 5,504,449 | 4/1996 | Prentice ............... 327/427 |
| 5,525,829 | * 6/1996 | Mistry ............... 257/473 |
| 5,525,925 | 6/1996 | Bayer ............... 327/377 |

(List continued on next page.)

OTHER PUBLICATIONS

K. throngnumachai, "A Study on the Effects of the Gate Contact Geometry and Dimensions on ESD Failure Threshold Level of Power MOSFETs", IEEE Trans. on Elec. Devices, vol. 41, n. 7, p. 1282.*

Kraison Throngnumchai, "A Study on the Effect of the Gate Contact Geometry and Dimensions on ESD Failure Threshold Level of Power MOSFET's", IEEE Transactions on Eletron Devices, vol. 41, No. 7, Jul. 1994, pp. 1282–1287.

*Primary Examiner*—Richard Booth
*Assistant Examiner*—Viktor Simkovic
(74) *Attorney, Agent, or Firm*—Skjerven Morrill MacPherson LLP; David E. Steuber

(57) ABSTRACT

One or more diodes are connected in a conductive path between the source and gate of a vertical MOSFET to prevent the voltage between the gate and source from exceeding a predetermined level and thereby protect the gate oxide layer from damage. The diodes are formed in the same polysilicon layer that is used to form the gate of the MOSFET, by implanting N and P-type dopants into the layer. To minimize the number of additional processing steps required, at least one of these implants is performed simultaneously with the implanting of the source or body of the MOSFET. As an additional aspect of the invention, the metal contact to the source and body regions in a vertical planar DMOSFET is formed by fabricating a sidewall spacer on the gate of the MOSFET. With the metal contact self-aligned to the gate in this way, the lateral dimension of each of the cells in the DMOSFET can be significantly reduced without the risk of a short between the contact and the gate, and the packing density of the cells can be increased. In this way, significant reductions in the on-resistance of the device can be achieved.

14 Claims, 20 Drawing Sheets

U.S. PATENT DOCUMENTS

| | | | |
|---|---|---|---|
| 5,629,542 | | 5/1997 | Sakamoto et al. .................... 257/328 |
| 5,631,187 | * | 5/1997 | Phipps et al. ......................... 438/237 |
| 5,661,322 | * | 8/1997 | Williams et al. .................... 257/331 |
| 5,767,550 | * | 6/1998 | Calafut et al. ....................... 257/355 |
| 5,777,367 | | 7/1998 | Zambrano ............................ 257/355 |
| 5,804,846 | * | 8/1998 | Fuller ................................... 257/252 |
| 5,805,123 | | 9/1998 | Satoh et al. ............................ 345/60 |
| 5,811,857 | | 9/1998 | Assaderaghi et al. ................ 257/355 |
| 5,818,084 | * | 10/1998 | Williams et al. .................... 257/329 |
| 5,909,139 | * | 6/1999 | Williams .............................. 327/434 |
| 5,923,210 | | 7/1999 | Le et al. ............................... 327/538 |
| 5,946,588 | * | 8/1999 | Ahmed et al. ....................... 438/585 |
| 5,998,836 | * | 12/1999 | Williams .............................. 257/341 |

\* cited by examiner

METHOD OF FORMING VERTICAL MOSFET DEVICE HAVING VOLTAGE CLAMPED GATE AND SELF-ALIGNED CONTACT

This is a continuation-in-part of application Ser. No. 09/001,768, filed Dec. 31, 1997, now abandoned, and is related to application Ser. No. 09/306,003, filed May 5, 1999, now U.S Pat. No. 6,172,383, issued Jan. 9, 2001, and application Ser. No. 09/293,380, filed Apr. 16, 1999. Each of the foregoing applications is incorporated herein by reference in its entirety.

BACKGROUND OF THE INVENTION

A key objective in designing power MOSFETs is to reduce the on-resistance, i.e., the resistance of the MOSFET when it is turned on, to as low a value as possible. One way to achieve this objective is to reduce the channel resistance by increasing the cell density of the device. This increases the total cell perimeter and thereby provides a greater total gate width through which the current flows. Another way is to improve the transconductance of the active transistor portion of each cell by creating greater electrostatic coupling between the gate and the silicon which makes up the channel region of the device. This can be done be decreasing the thickness of the gate oxide layer (the layer, typically silicon dioxide, that separates the gate from the channel), which provides a lower threshold voltage and improved electrostatic coupling between the gate and the channel.

The gate oxide cannot be thinned without limit, however, because making the gate oxide thinner reduces the maximum gate voltage that can be applied to the device without rupturing the gate oxide and permanently destroying the MOSFET. It is difficult to design gate drive circuitry whose output is regulated within strict limits, and furthermore many circuits are subject to certain fault conditions (e.g., voltage spikes arising from transient conditions) that occasionally subject the gate to much higher than normal operating voltages. These conditions require the designer to thicken the gate oxide layer. In essence, the normal performance of the device is significantly compromised to protect against rare occurrences.

Thus there is a clear need for ways of safely reducing the thickness of the gate oxide layer and increasing the cell density of power MOSFET.

SUMMARY

According to the method of this invention, the gate oxide layer of a vertical MOSFET is protected by forming one or more voltage clamping diodes in a conductive path between the gate and the source of the MOSFET. The clamping diodes are formed by implanting N and P-type dopants into the same polysilicon layer that is used to form the gate. To minimize the number of additional masking steps required, one terminal of each diode is formed by implanting dopant into the polysilicon layer during the implantation of the body region of the MOSFET and the other terminal of each diode is formed by implanting dopant into the polysilicon layer during the implantation of the source region of the MOSFET. Thus, for an N-channel MOSFET the anode is formed with the body implant and the cathode is formed with the source implant. In some situations, additional dopant may be required to achieve the desired breakdown voltage of the diode. In other situations, particularly where a high breakdown voltage is required, the source or body implant may provide too much dopant and the polysilicon layer may have to be masked during the either or both of the source and body implants. In still other situations, only one of the diode terminals is formed by using the source or body implant, with the other terminal being doped a separate processing step.

The polysilicon layer in which the diodes are formed can be patterned, using standard photolithographic techniques, to create various arrangements of diodes. Metal layers are deposited and patterned to connect the diodes between the source and gate of the MOSFET to provide the voltage clamping function. In some embodiments, current-limiting resistors can be fabricated in the polysilicon layer to protect the diodes should the voltage need to be clamped.

As an additional aspect of the process, the lateral dimension between the gate sections in a vertical planar DMOSFET is reduced by self-aligning the gate with the contact to the source region. This avoids the need to be concerned about possible shorting between the gate and the contact which is inherent in a technology wherein the gate and the hole in which the contact is located are defined in successive masking steps as described above.

The first part of the process includes the formation of a the source and body regions in a vertical planar DMOSFET. Conventionally, this process begins with a semiconductor body which in many cases will comprise an epitaxial layer of a first conductivity type grown on a surface of a semiconductor substrate of the same conductivity type. A gate oxide layer is formed on a surface of the semiconductor body, and a conductive gate layer is formed on the gate oxide layer. A portion of the conductive gate layer is removed to define the gate, which is typically an interlinked lattice of sections connecting an array of MOSFET cells. A first dopant of a second conductivity type is implanted into the semiconductor body to form a body region, and the semiconductor body is heated to drive in the first dopant. A second dopant of the first conductivity type is implanted into the epitaxial layer to form a source region. In both of these implants the gate is normally used as a mask so that the source and body regions are self-aligned with the gate.

Importantly, an oxide layer is then formed overlaying the gate and a first portion of the source region. The oxide layer is anisotropically etched so to as expose a portion of the source region while leaving a spacer portion of the oxide layer on a sidewall of said gate, thereby forming a contact opening. The contact opening is thus self-aligned with the gate. The contact opening is then filed with a conductive material, typically a metal, so as to form an electrical contact to the source region.

There are numerous variations of this process. Frequently the gate will consist of doped polycrystalline silicone (polysilicon), and a layer of polysilicon oxide will be formed on top of the gate before the oxide layer is formed. The semiconductor body is often masked before the source implant to prevent the source dopant from reaching a portion of the semiconductor body, allowing a portion of the body region to remain at the surface of the semiconductor body. The anisotropic etching of the oxide layer exposes at least a portion of the body region so that the contact opening provides for a source/body contact.

What is described is thus a relatively simple means of reducing the lateral dimension between the gate sections and thereby increasing the density packing of the cells in a vertical planar DMOSFET. This holds the potential for significantly reducing the on-resistance of the DMOSFET without the added cost of using expensive steppers and other equipment.

BRIEF DESCRIPTION OF THE DRAWINGS

This invention will be better understood by reference to the following description and drawings, in which.

DESCRIPTION OF THE INVENTION

The above-referenced applications describe various techniques for using diodes to clamp the voltage at the gate of a MOSFET and thereby protect the gate oxide layer from ESD pulses and other excessive voltages. Assuming that the MOSFET is formed in an integrated circuit (IC) chip, it is desirable to accomplish this in a way that yields a high cell density and minimizes the number of processing steps, particularly the number of masking steps.

Figure 1:
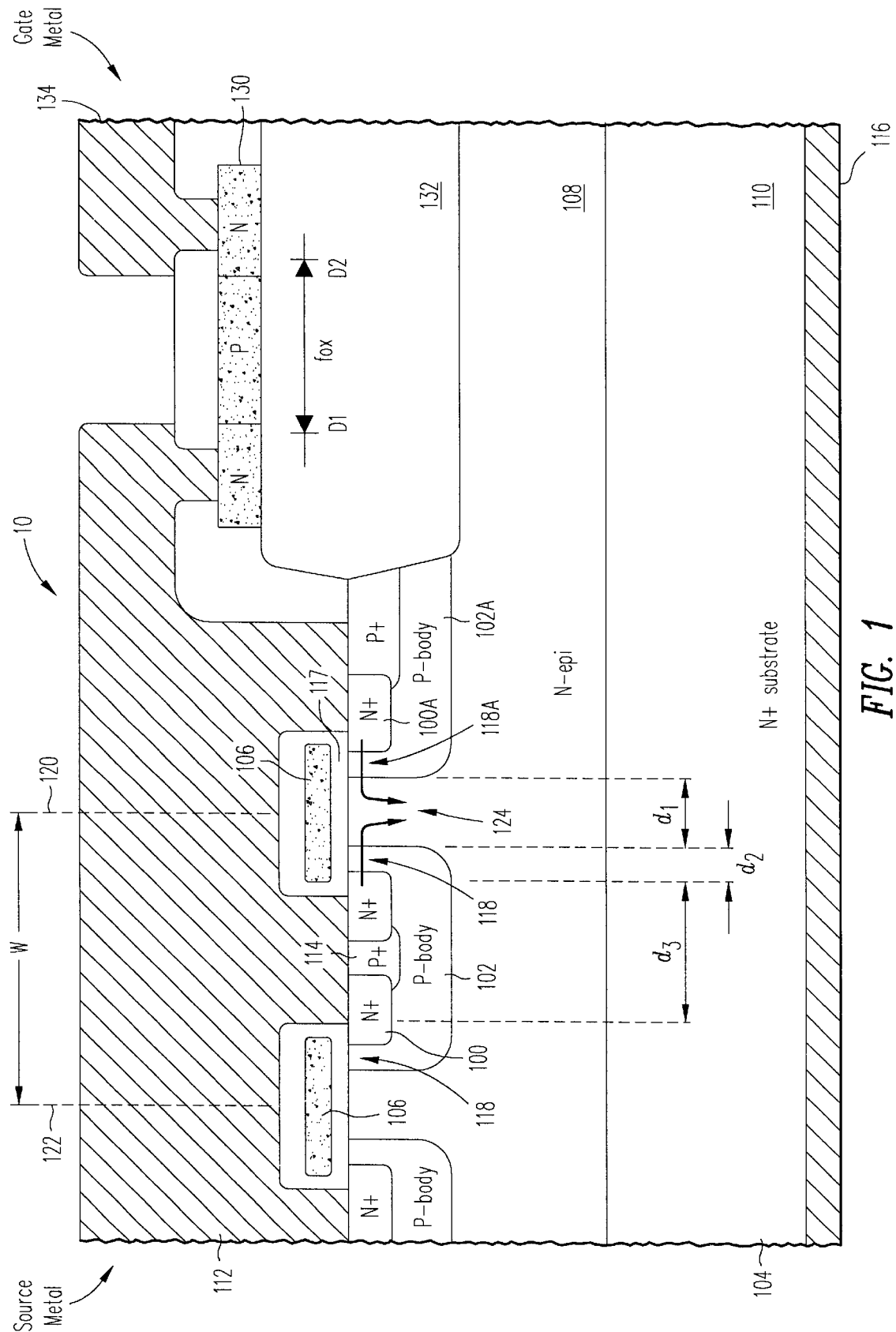
FIG. 1 shows a cross-sectional view of a vertical planar DMOSFET containing a pair of voltage clamping diodes.

A cross-sectional view of a typical vertical planar DMOSFET (i.e., double-diffused MOSFET) is shown in FIG. 1. DMOSFET 10 contains a source region 100, a body region 102, a drain region 104, and a gate 106. Source region 100 and body region 102 are formed in an epitaxial (epi) layer 108 which overlies a substrate 110. A source metal layer 112 contacts source region 100 and body region 102, a heavily doped body contact region 114 facilitating contact with the body region 102. A metal layer 116 contacts the drain region 104. The gate 106 is separated from the surface of the epi layer 108 by a gate oxide layer 117. Channel regions 118 are located in the body region 102 near the surface of the epi layer 108.

The pattern is repeated in epi layer 108, and FIG. 1 shows a portion of a neighboring source region 100A, body region 102A and channel region 118A. A single section of the gate 106 controls the flow of current (denoted by the arrows) through both of the channel regions 118 and 118A. The currents from channel regions 118 and 118A come together in a region of the epi layer 108 between the body regions 102 and 102A that is sometimes referred to as the "JFET" region, denoted by numeral 124 in FIG. 1.

Also shown in FIG. 1 is a pair of voltage clamping diodes, illustrated schematically as D1 and D2, which are formed in a polysilicon layer 130 over a field oxide region 132. Diodes D1 and D2 are connected in series anode-to-anode between source metal layer 112 and a gate metal layer 134 in the manner described in the above-referenced application Ser. No. 09/001,768, now abandoned.

While MOSFET 10 is shown as an N-channel device, a similar P-channel device has the same structure with the polarities of the various regions reversed.

A single "cell" of MOSFET 10 can be defined as having a width W that extends between a line 120 at the center of one section of gate 106 to a line 122 at the center of a another section of gate 106 on the opposite side of the source region 100 and body region 102. The cell can have various shapes and can be either in the form of a closed polygon (e.g., a square or hexagon) or a longitudinal strip.

Generally speaking, the current-carrying capacity of the MOSFET can be increased (and the on-resistance reduced) by packing more cells into a unit area of the surface of the device. This increases the total perimeter of the cells and the total channel "width" through which the current may flow. The packing density of the cells is a function of the cell width W.

There are limitations, however, on reducing W. The width of the JFET region 124 (shown as $d_1$) can be reduced only to certain point without increasing current-crowding in the JFET region 124 and increasing the on-resistance of the device. The length of the channel, shown as $d_2$ cannot be reduced without risking punchthrough breakdown, i.e., the undesirable condition where the maximum operating voltage of a MOSFET is reduced by depletion of the channel (body region), leading to the loss of gate control of the conduction current.

Figure 2:
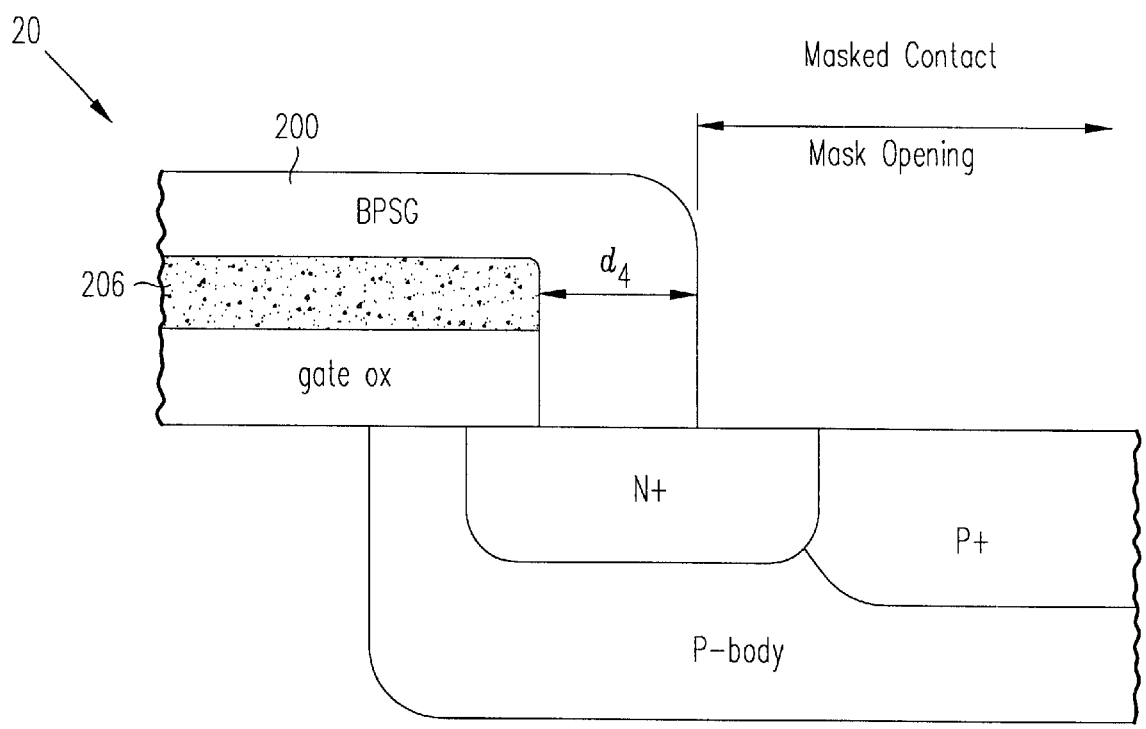
FIG. 2 shows a detailed cross-sectional view of the region between the gate and the source contact in a vertical planar DMOSFET.

What remains is the possibility of reducing the distance between the sections of gate 106, shown as $d_3$. The problem is to insure that a separation is maintained between gate 106 and metal layer 112. The gate 106 and the metal layer 112 are normally formed by photolithographic processes which involve masking and etching. FIG. 2, for example, shows a mask opening that is used to form an opening in a BPSG layer 200 for the source/body contact in a MOSFET 20. The distance $d_4$ represents the separation between the gate 206 and the (future) contact.

Photolithographic processes are subject to errors in the lateral sizes and positioning of the elements defined. In these circumstances, the following formula expresses the minimum permissible design spacing between gate 106 and metal layer 112:

$$\text{GateMetalSpacing}_{min} = \sqrt{\Delta CD_{gate}^2 \Delta CD_{contact}^2 + MA_{gate/contact}^2}$$

where $\Delta CD_{gate}$ is the is the variation in the critical dimension of the gate 106, $\Delta CD_{contact}$ is the variation in the critical dimension of the contact (metal layer 112), and $MA_{gate/contact}$ is the potential misalignment between the gate and contact. If this separation is not maintained, there is an unacceptable risk that the gate will be shorted to the metal contact, and the MOSFET will be permanently disabled. In a low cost production process a projection aligner or 1× stepper would be used and the variations in the critical dimension and potential misalignment would be relatively large. These values can be reduced by using, for example, a 5× reduction stepper, but this increases the cost significantly. The distance $d_3$ is typically from $0.5\mu$ to $2.0\mu$, and only with very expensive equipment can $d_3$ be reduced much below $0.5\mu$.

The first part of a process according to this invention entails the formation of the source and body regions in a vertical planar DMOSFET. While the process is subject to some variations, in general a gate is defined and then used as a mask for the implantation of the source and body regions. In this way the gate is self-aligned to the source and body regions. The channel region is formed by a difference in the extent of the diffusion of the source and body regions laterally under the gate.

Figure 3A:
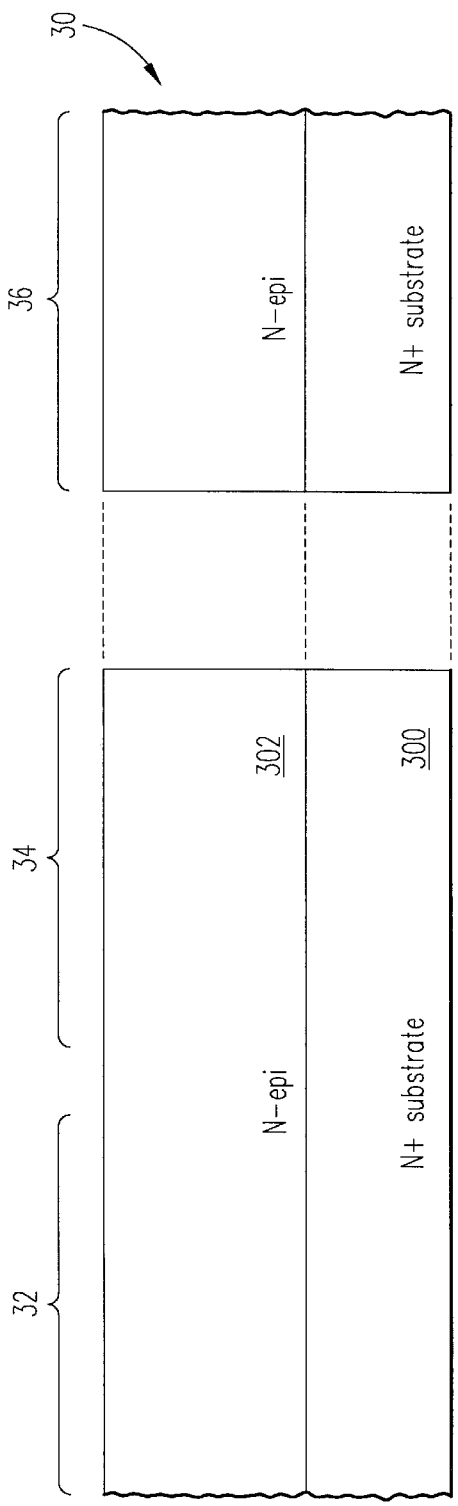
FIGS. 3A–3O show a process sequence for fabricating a vertical planar DMOSFET having a voltage clamped gate and a self-aligned contact in accordance with this invention.

FIGS. 3A through 3O illustrate the initial portion of this process. While the process is described in the context of an N-channel MOSFET, it can also be performed for a P-channel MOSFET by reversing the polarities of the materials and implants. In general, the lefthand portion of each figure shows a cross-sectional view of an "active" area 32, where the MOSFET is to be formed, and a termination area 34, while the righthand portion shows a diode area 36 where the one or more voltage clamping diodes are to be formed. These areas could be at various cross-sections on the chip. Their relative positions in FIGS. 3A–3O are illustrative only.

As shown in FIG. 3A, the process begins with an N+ substrate 300 on which an N-type epitaxial (epi) layer 302 is grown. For a 6-inch wafer substrate 300 might be on the order of 18–20 mils thick, and it could be thicker for an 8- or 12-inch wafer. Substrate 300 is heavily doped with phosphorus or arsenic, preferably to a resistivity of less than 5 mΩ-cm and ideally about 3 mΩ-cm. N-epi layer 302 is generally doped with N-type impurity to a concentration of from $8 \times 10^{15}/cm^3$ to $1 \times 10^{17}/cm^3$, depending on the breakdown voltage of the MOSFET, which could be from 8V to 60V, with 12V, 20V and 30V being common breakdown voltages. Together N+ substrate 300 and N-epi layer 302 form a semiconductor body 30.

Figure 3B:
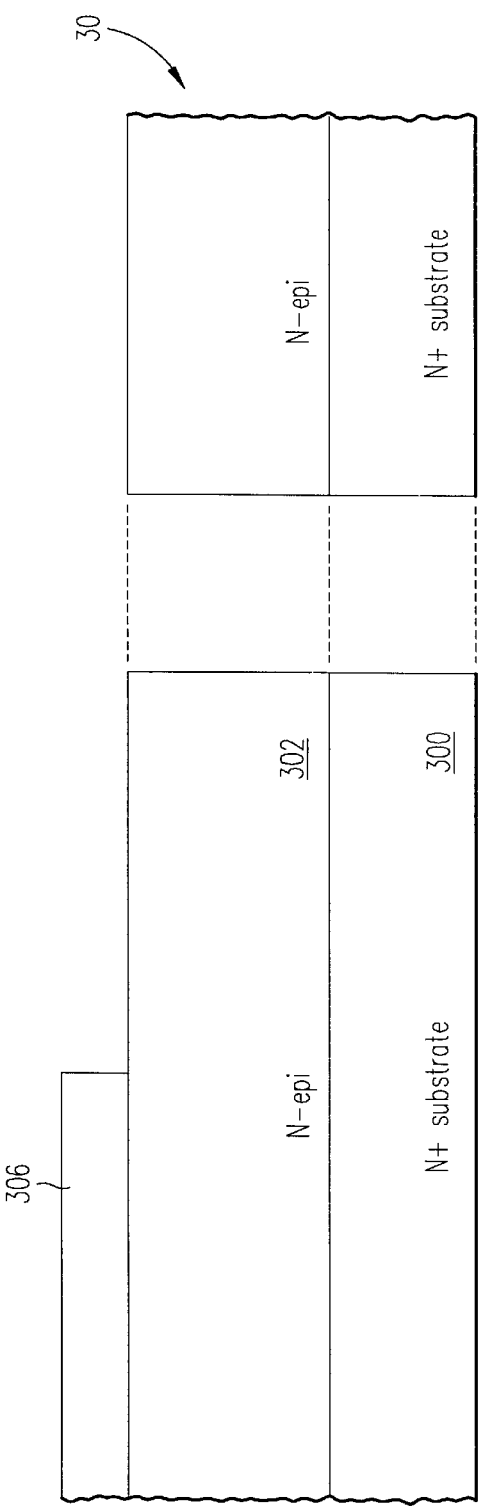
Figure 3C:
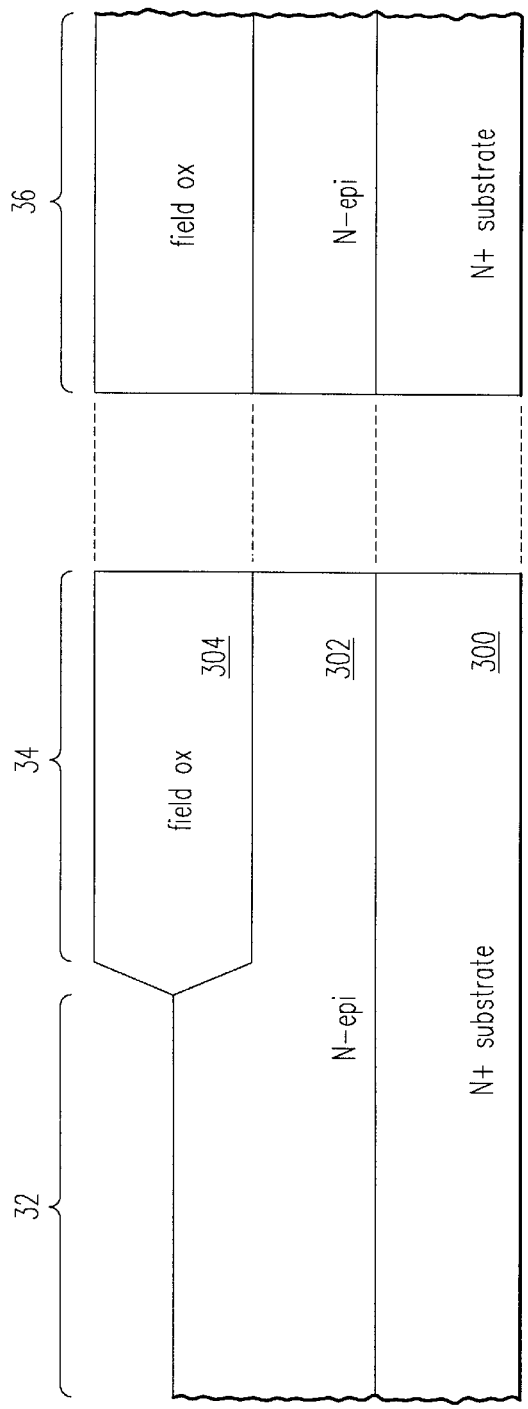

As shown in FIGS. 3B and 3C, a field oxide region 304 is grown in N-epi layer 302 in the termination area 34 and the diode area 36 of the MOSFET. Using the well-known LOCOS (local oxidation of silicon) process, a nitride layer 306 is formed in the active area 32, and semiconductor body 30 is heated in oxygen or steam at a temperature of from 900 to 1150° C. for from 30 minutes to 3–4 hours. This is done in accordance with well-known oxidation curves that are available in numerous textbooks. Nitride layer 306, which prevents oxidation from occurring where the MOSFET is to be located, is then stripped. Field oxide region 304 is generally from 2000 Å to 1.5μ thick, 5000 Å being typical. Alternatively, field oxide region 304 could be thermally grown over the entire surface of N-epi layer 302 and etched back in the active area 32, where the MOSFET is to be located.

Figure 3D:
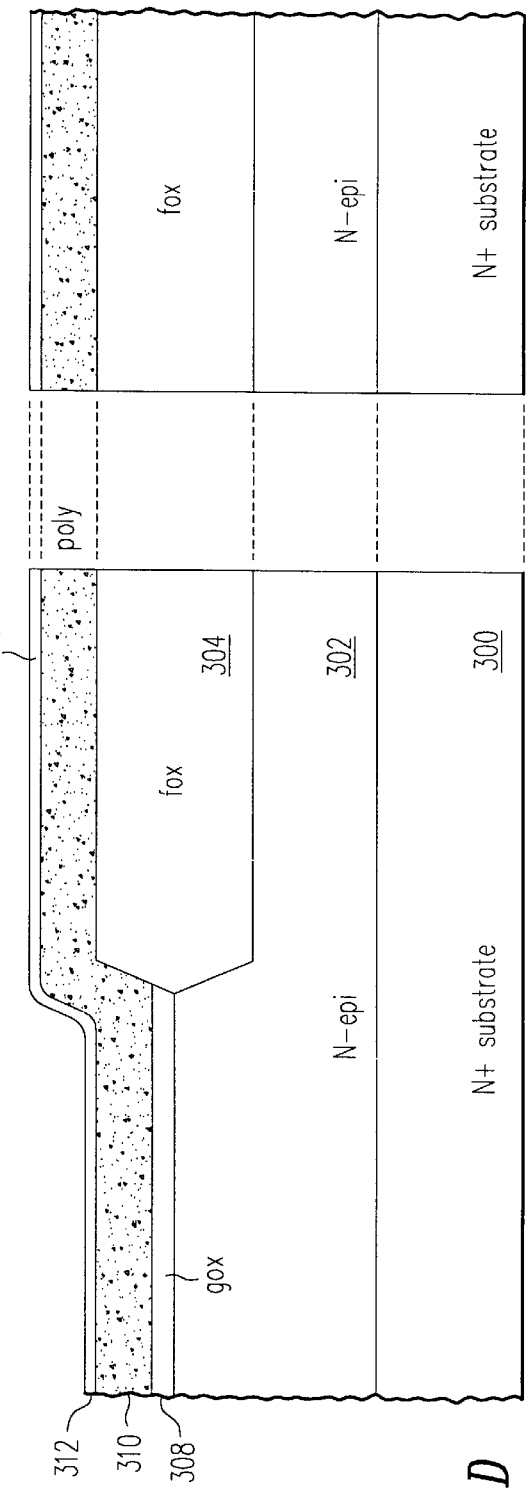

As shown in FIG. 3D, a gate oxide layer 308 is then grown on the exposed surface of N-epi layer 302. Gate oxide layer 308 is normally from 90 Å to 1200 Å thick, with 500 Å, 300 Å, 175 Å and 120 Å being common gate oxide thicknesses for devices having gate voltage ratings of 20V, 12V, 7–8V and 5V, respectively. Gate oxide layer 308 can be grown in dry oxygen, often in the presence of a chlorine source such as TCA or hydrochloric acid to provide an ionic barrier, at 900 to 1150° C. (typically 1000 to 1050° C. for 20 minutes to 3–4 hours.

A polysilicon layer 310 is then deposited on gate oxide layer 308 using a chemical vapor deposition process, or alternatively polysilicon layer 310 can be deposited as amorphous silicon and recrystallized. Usually polysilicon layer 310 is in the range of 2000 Å to 5000 Å thick. Optionally, a thin polysilicon oxide layer 312 is grown or deposited on the top surface of polysilicon layer 310. Thin polysilicon oxide layer 312 can be grown by heating at 900 to 1050° C. for 15 to 30 minutes. Thin polysilicon oxide layer 312 is several hundred Angstroms thick and seals polysilicon layer 310 to protect it from contamination from the reactor during subsequent implants.

Figure 3E:
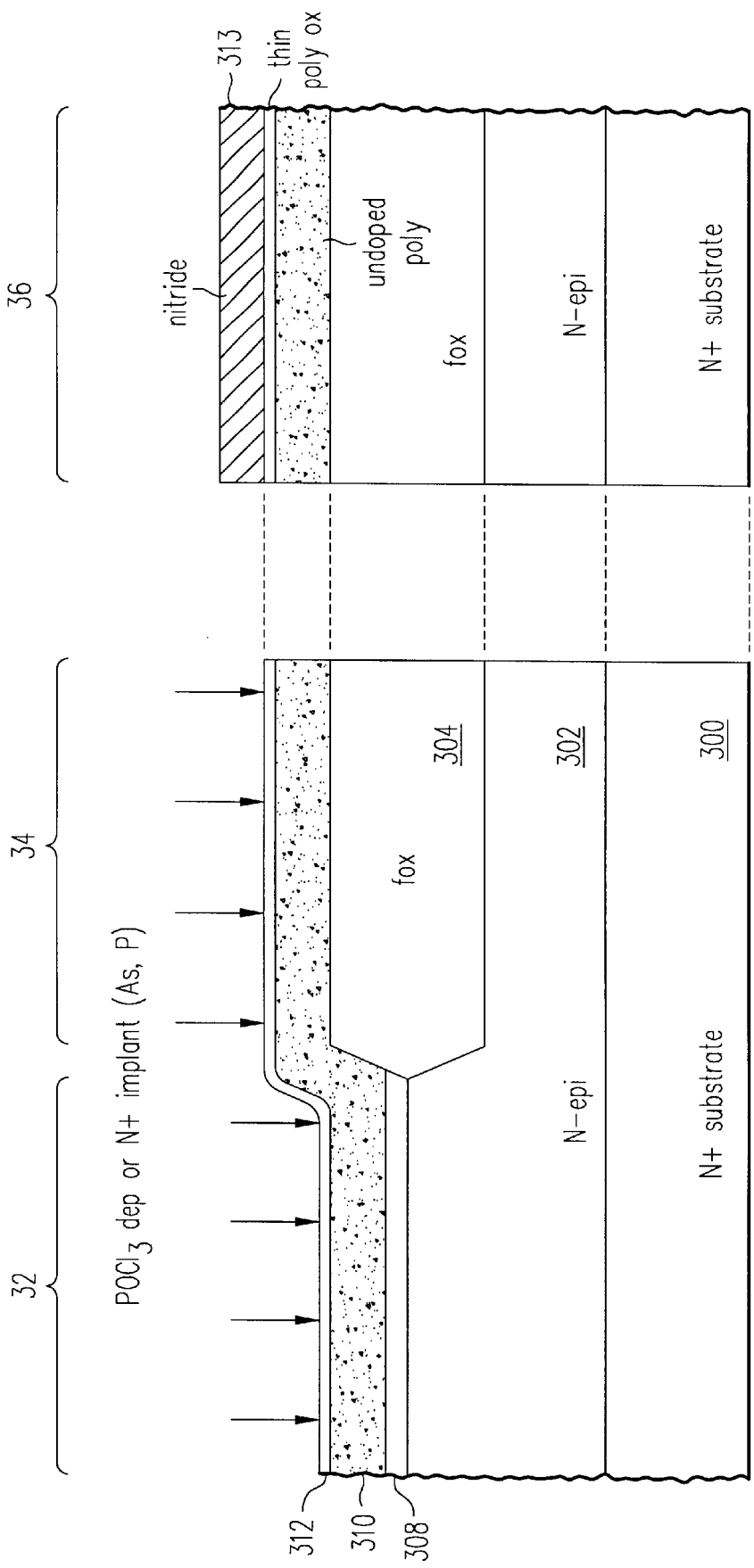

As shown in FIG. 3E, a nitride layer 313 is then deposited, preferably by chemical vapor deposition, to a thickness of from 1000 Å to 6000 Å. Nitride layer 313 is formed of a high temperature nitride. Nitride layer 313 is then masked and etched from the active area 32 and the termination area 34, leaving it in the diode area 36.

An N-type dopant such as As or P is implanted into polysilicon layer 310 if the MOSFET is to be an N-channel device. This implant can be carried out at a dose of $1 \times 10^{15}/cm^2$ to $1 \times 10^{16}/cm^2$ at 30 keV to 80 keV, with 60 keV being common. Alternatively, polysilicon layer 310 can be doped with N-type impurity using a $POCl_3$ predeposition. If the MOSFET is to be a P-channel device, a BN (boron nitride) predeposition can be carried out at 800 to 1100° C. This dopant goes into the area where the gate of the MOSFET is to be located, but nitride layer 313 prevents the dopant from entering the polysilicon layer 310 in the area where the diodes are to be formed.

Figure 3F:
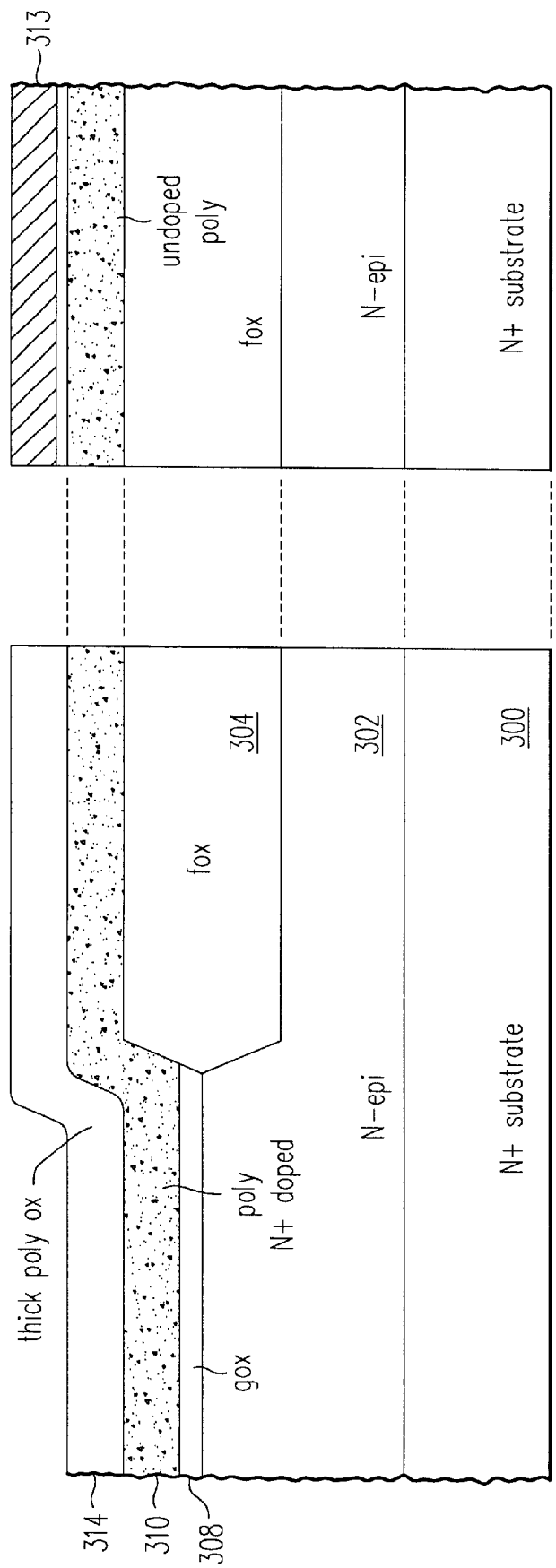

As shown in FIG. 3F, thin polysilicon oxide layer 312 is stripped, and an optional thick polysilicon oxide layer 314 is grown on polysilicon layer 310 to a thickness of from 1000 Å to 5000 Å. The oxidation may occur for 30 minutes to 3 hours at a temperature in the range of 900 to 1100° C. Nitride layer 313 prevents, the thick oxide layer 314 from forming in the diode area 36.

Nitride layer 313 is then stripped. Optionally, a blanket boron implant is carried out at a dose of $5 \times 10^{12}/cm^2$ to $5 \times 10^{13}/cm^2$ and at 30 to 80 keV to form the anodes of the diodes; alternatively, the anodes can be formed by the body implant discussed below. A doped oxide can also optionally be deposited to a thickness of from 1000 Å to 5000 Å to help smooth out the surfaces and improve the step coverage. A layer of doped borophosphosilicate glass (BPSG) (not shown) can be deposited on the thick polysilicon oxide layer 314. Alternatively, a BPSG layer can be deposited in lieu of thick polysilicon oxide layer 314.

Figure 3G:
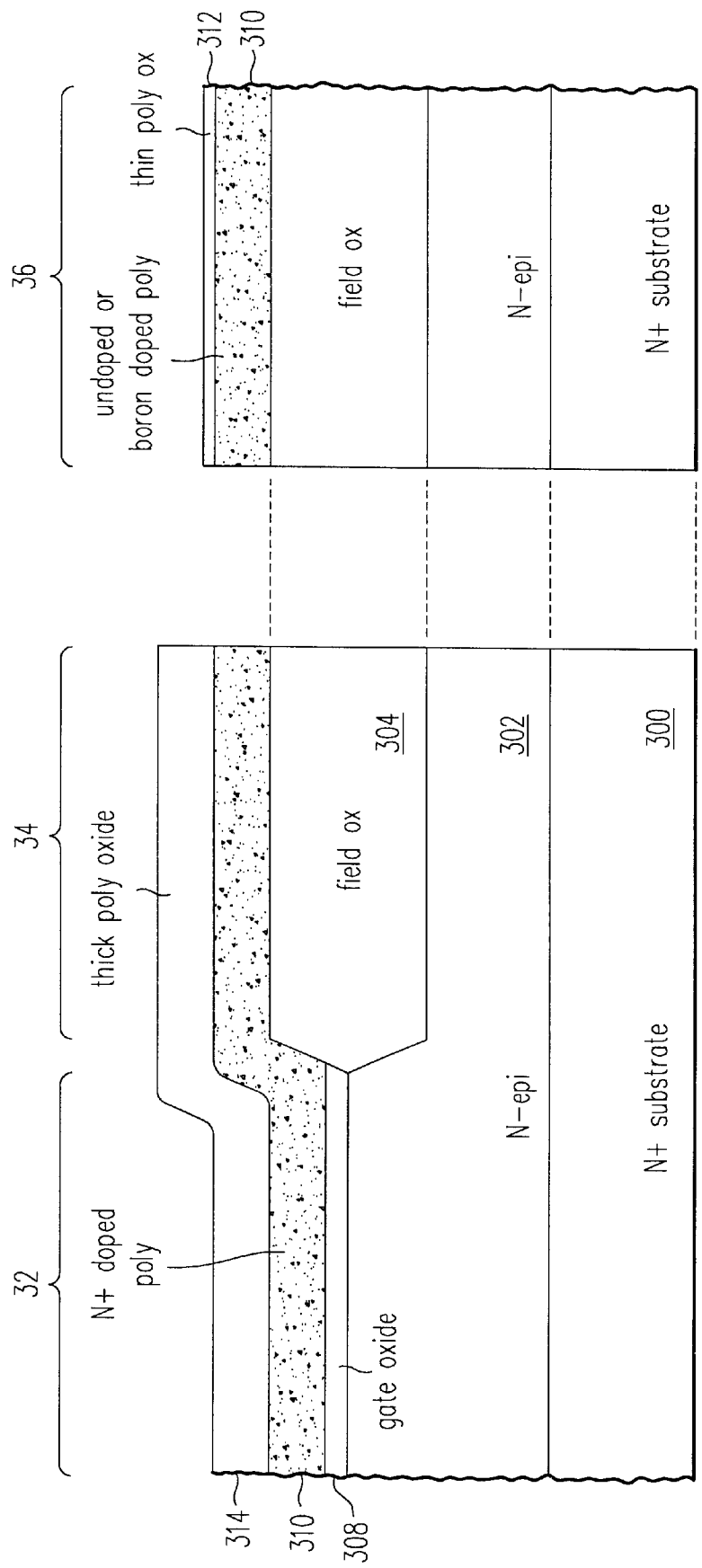

This yields the structure shown in FIG. 3G, with the polysilicon layer 310 heavily doped with N-type impurity in the active area 32 and termination area 34 and lightly doped with boron (or undoped) in the diode area 36.

Figure 3H:
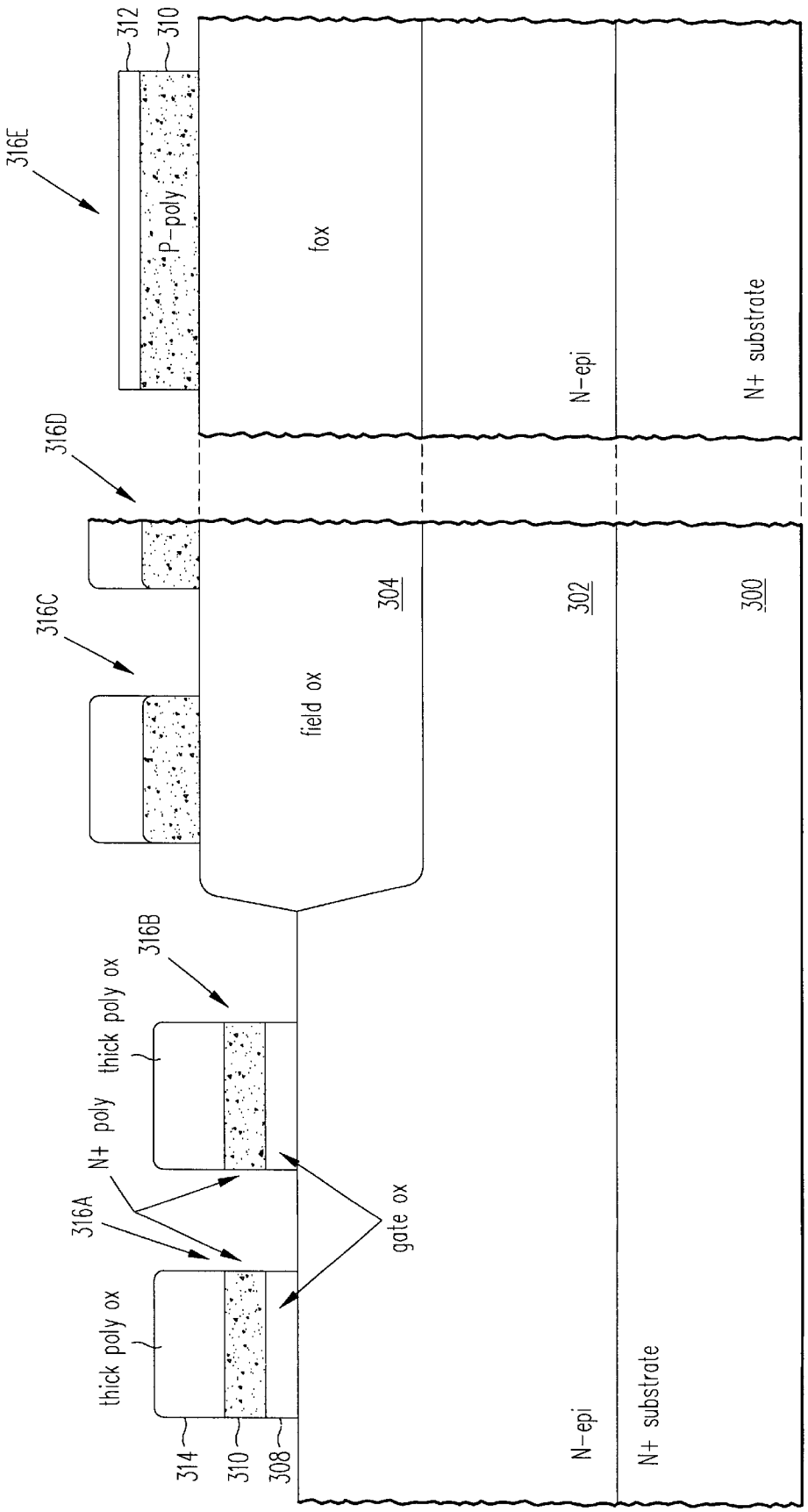

As shown in FIG. 3H, the structure is masked with a photoresist layer (not shown) to define the gate, and thick polysilicon oxide layer 314, polysilicon layer 310 and gate oxide layer 308 are etched using an anisotropic etching technique such as reactive ion etch (RIE) or plasma etch to provide gate sections 316A and 316B having straight vertical sidewalls. The photoresist mask is patterned such that portions of polysilicon layer 310 consisting of a source plate 316C and a drain plate 316D remain on top of field oxide region 304 in the termination region 34. The masking and etching also leave a diode section 316E consisting of polysilicon layer 310 and thin polysilicon oxide layer 312 in the diode area 36. The photoresist mask is then stripped.

Figure 3I:
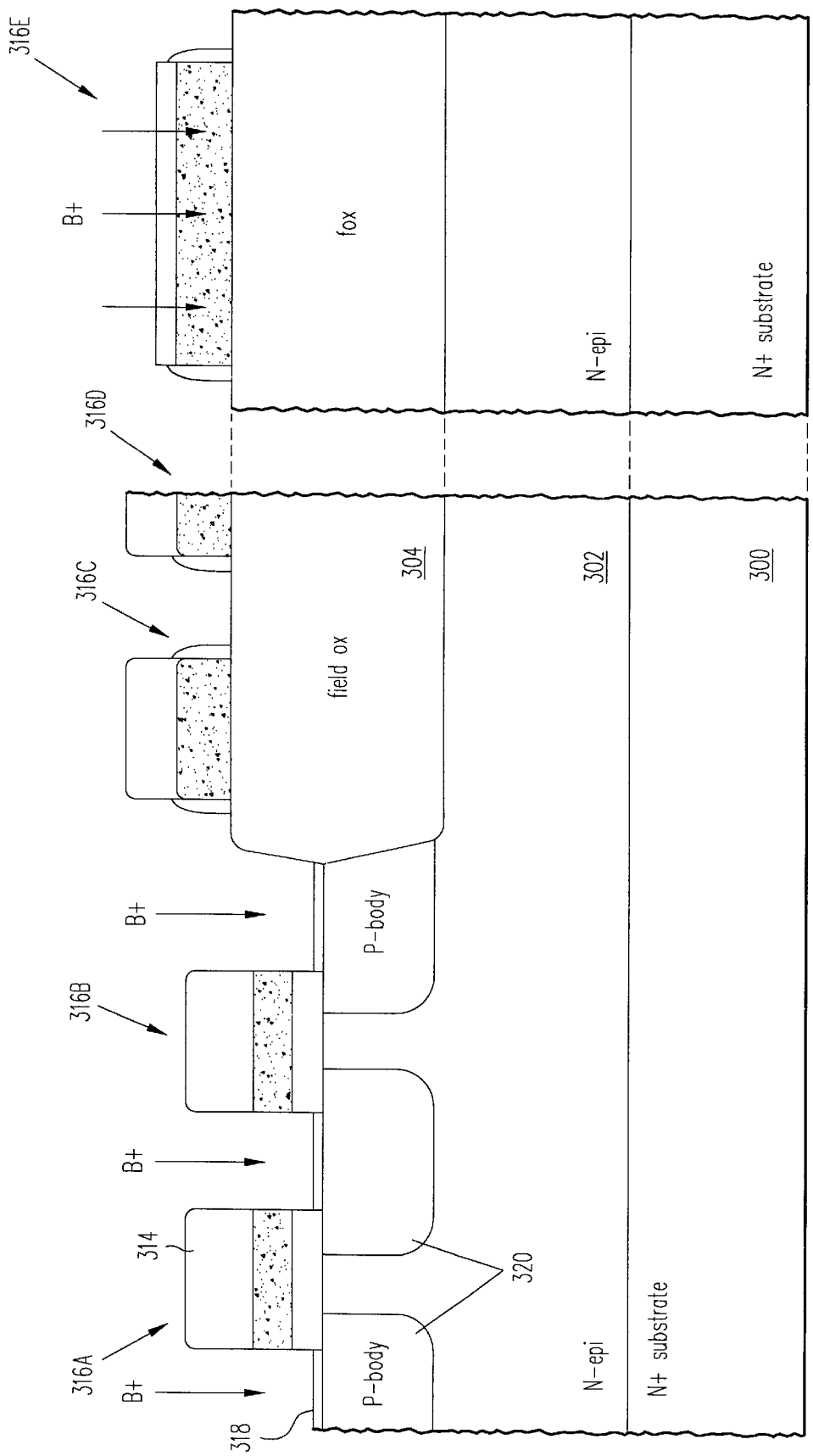

As shown in FIG. 3I, a thin oxide layer 318 is formed on the surface of N-epi layer 302, and P-body regions 320 are formed by implanting boron at a dose of $5 \times 10^{13}/cm^2$ to $1 \times 10^{14}/cm^2$ at 60 keV to 300 keV, typically about 80 keV. The boron does not penetrate the thick polysilicon oxide layer 314 significantly, and to the extent that it does it has no significant effect on the concentration level of dopant in gate sections 316A and 316B because gate sections 316A and 316B are heavily doped with N-type dopant. However, the boron does penetrate through the thin polysilicon oxide layer 312 of the diode section 316E in the undoped or lightly doped region of the polysilicon layer 310. Thin polysilicon oxide layer 312 is necessary to insure that the boron goes into the poly silicon layer 310.

P-body regions 320 are driven in at 1000° to 1200° C. (typically 1100° to 1150° C.) for from 30 minutes to 6–7 hours, depending on the depth of the P-body regions desired. Typical depths for the P-body regions are from 1μ to 3μ. As indicated in FIG. 3I, after P-body regions 320 have been driven in, they extend laterally some distance under gate sections 316A and 316B.

Figure 3J:
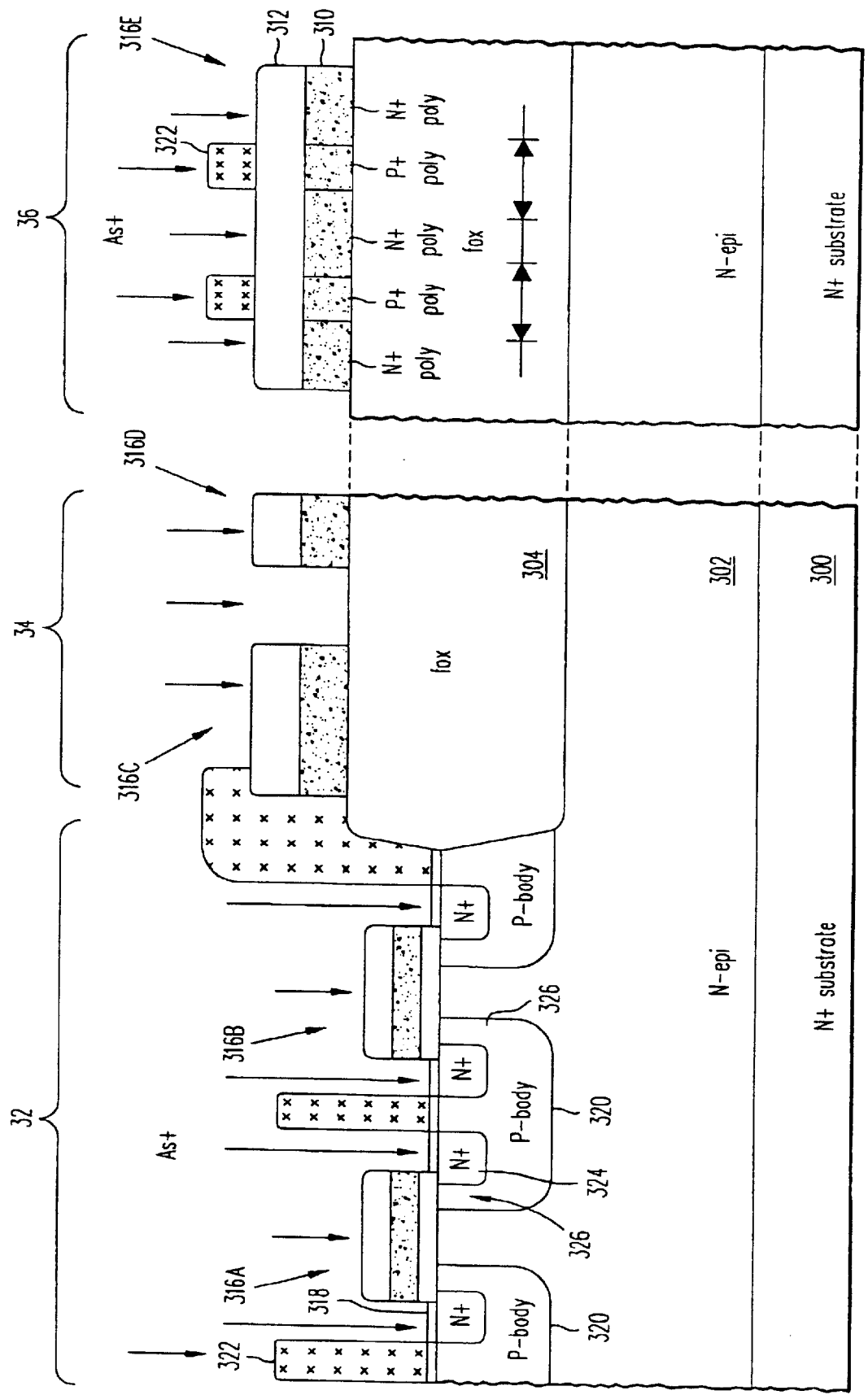

As shown in FIG. 3J, a photoresist layer 322 is applied, photoresist layer 322 having openings which define the source regions of the MOSFET. N-type dopant (arsenic or phosphorus) is implanted at a dose of $1\times10^{15}/cm^2$ to $1\times10^{16}/cm^2$ ($5\times10^{15}/cm^2$ to $7\times10^{15}/cm^2$ being preferred) at 40 keV to 120 keV, preferably about 100 keV. The implanted N-type dopant is diffused by heating it at 900° to 1100° C. for from 20 minutes to 1 hour. This drives the N-type dopant in to a depth of from $0.2\mu$ to $0.6\mu$, with $0.4\mu$ being typical. The result is N+ source regions 324. Channel regions 326, having a length of from $0.8\mu$ to $0.9\mu$ are formed under the gate sections 316A and 316B. The N-type dopant penetrates the thin oxide layer 318 but does not penetrate the thick polysilicon oxide layer that overlies the gate sections 316A and 316B.

In the diode area 36, photoresist layer 322 is patterned so as to cover the regions that are to be the anodes of the diodes, leaving openings over the regions that are to be the cathodes. The introduction of the N-type dopant into the polysilicon layer 310 counterdopes the boron that was previously implanted and forms the cathodes of the diodes. The portions of polysilicon layer 310 lying under the photoresist layer 322 remain lightly doped with boron and form the anodes of the diodes. It is the lightly doped anodes that set the breakdown voltage of the diodes. If a breakdown voltage higher than what results from using the P-body implantation to form the anodes is desired, it is necessary to mask the anodes during the P-body implantation. Conversely, a lower breakdown voltage can be obtained by an additional blanket implantation of the diode region with P-type dopant. In other words, so along as the breakdown voltage obtained from the P-body implant is as high or higher than the desired breakdown voltage, the breakdown voltage can be adjusted downward by an additional implant of P-type dopant. Generally speaking, the P-body implant alone will yield a breakdown voltage in the neighborhood of 7 to 7.5 V.

In the embodiment of FIG. 3J two pairs of diodes, one pair forward-biased and the second pair reverse-biased, are formed, but depending on the patterning of the photoresist layer 322 any combination of forward and reverse-biased diodes can be formed.

Following the formation of the N+ source regions 324, photoresist layer 322 is stripped.

Figure 3K:
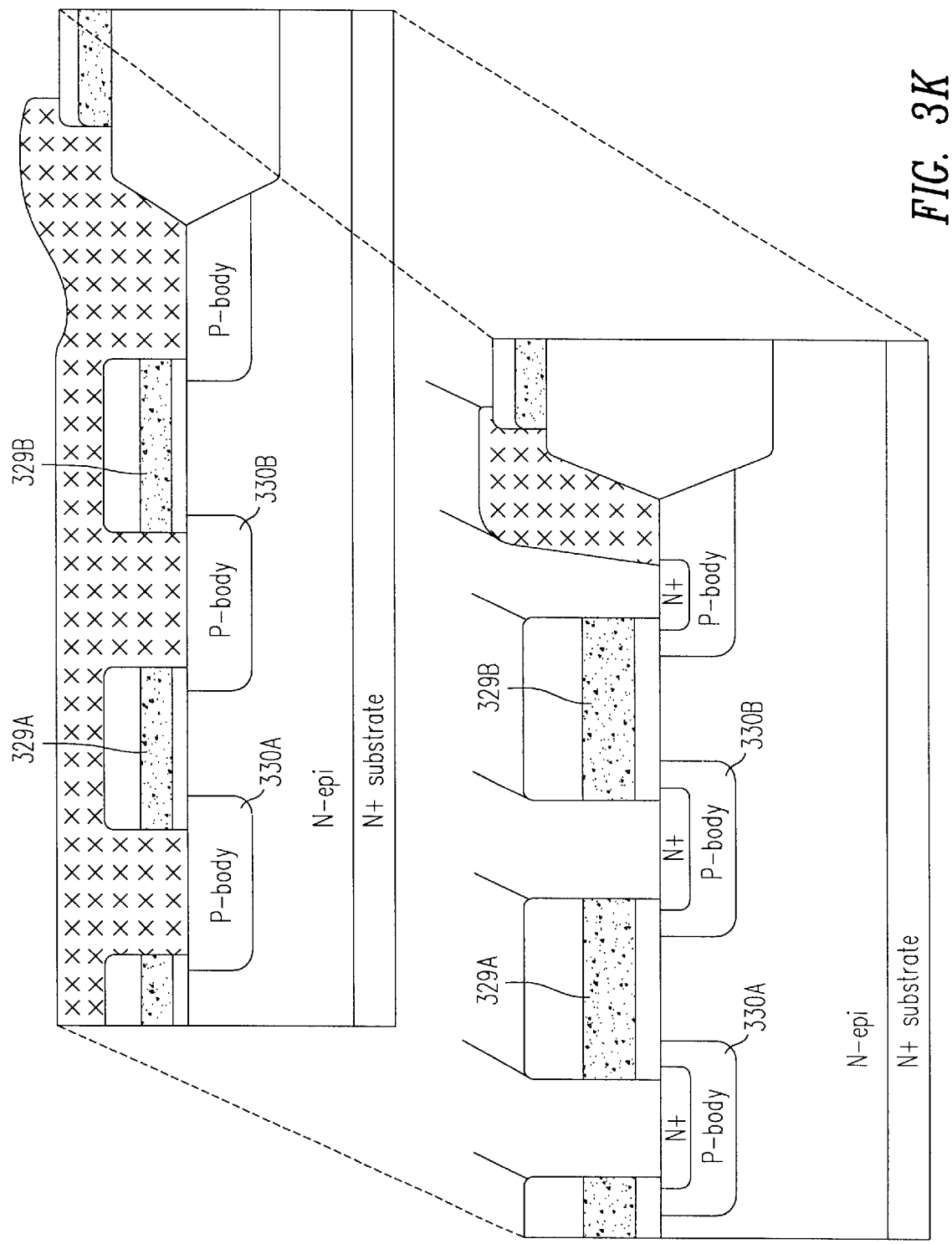

In FIG. 3J, the photoresist layer 322 between the gate sections 316A and 316B ensures that the P-body regions 320 reach the surface of N-epi layer 302 so that the P-body may be contacted by the metal contact. FIG. 3K shows an alternative embodiment wherein gate sections 329A and 329B and P-body regions 330A and 330B are in the form of longitudinal stripes and wherein photoresist layer 332 is not deposited on the P-body regions 330A and 330B. In this embodiment the P-body regions are not contacted within the individual MOSFET cells, and the P-body contact (if there is one) is made somewhere else on the chip.

Figure 3L:
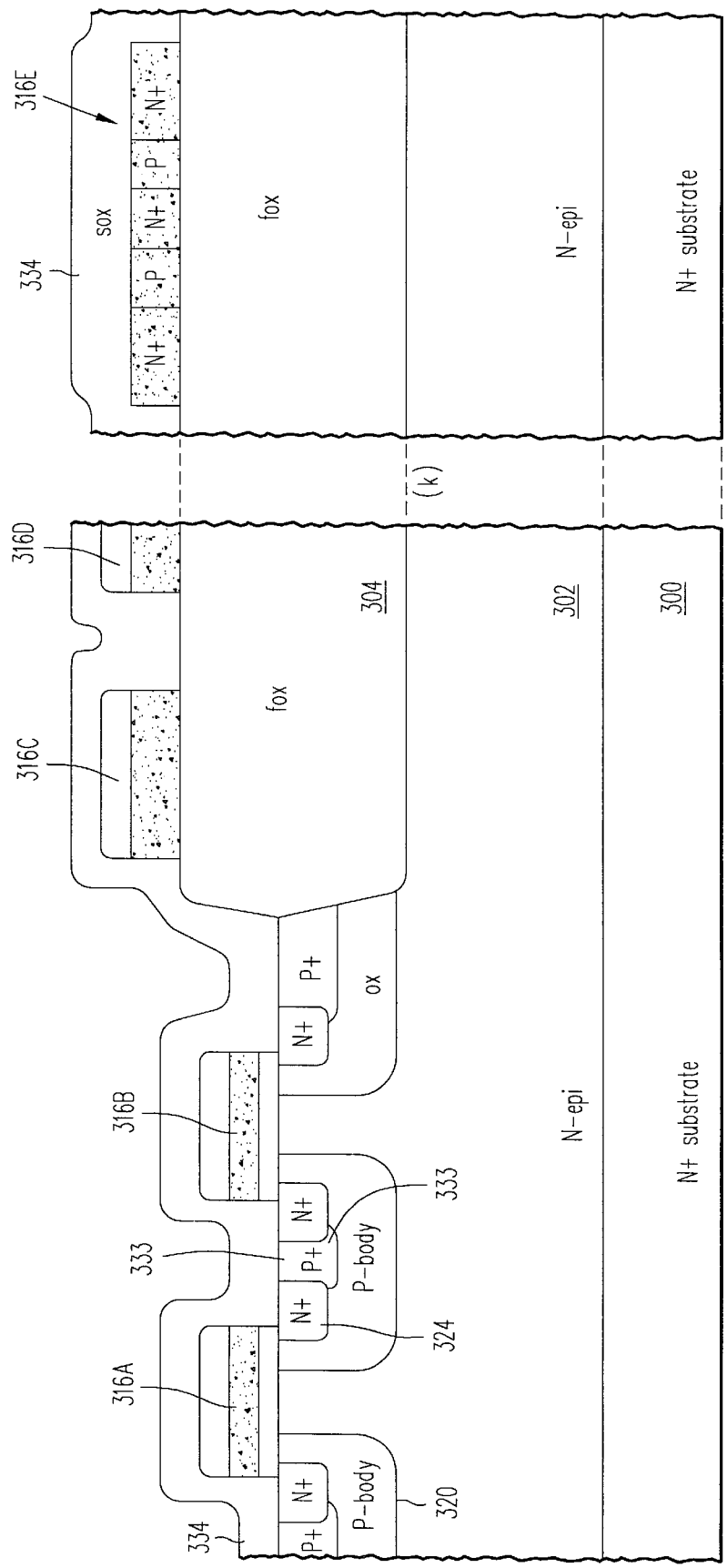

Assuming that there is to be a P-body contact in each cell, a blanket implant of a P-type dopant such as boron is then performed to form P+ body-contact regions 333, as shown in FIG. 3L. This body-contact implant is carried out at a dose of from $5\times10^{14}/cm^2$ to $2\times10^{15}/cm^2$ and at 20 keV to 80 keV. Since the dose of this body-contact implant is only one-third to one-half of the dose of the N-type implant used to form N+ source regions 324, the P-body contact implant does not significantly affect the net concentration of dopant in N+ source regions 324. The body-contact implant will also pass into the polysilicon layer 310 within the diode area 36. If it is not desired to have the body-contact implant remain in the polysilicon layer 310, the energy can be increased to 120 to 150 keV in which case it will shoot past the polysilicon layer 310 and into the field oxide region 304. Alternatively, the doping of the P-regions (anodes) in polysilicon layer 310 can be preset such that the addition of the body-contact implant brings the P-regions to the required dopant concentration for the desired breakdown voltage.

In a conventional process, the next step would normally be to deposit a layer of an insulating material such as BPSG glass, reflow it and then etch it to form an opening for the source contact. This presents the risks of misalignment discussed above, and to insure that the contact is not shorted to the gate the dimension $d_3$ must be maintained at or above a specified level, thereby limiting the cell packing density.

In contrast, according to this invention a spacer layer 334, shown in FIG. 3L, is deposited on the top surface of the chip. Spacer layer 334 will normally be from 2000 Å to $1.0\mu$ thick, and often in the range of 4000–5000 Å thick. Spacer layer 334 preferably consists of silicon dioxide ($SiO_2$), but it may be formed of a variety of other materials such as spin-on-glass and chemical vapor deposited BPSG.

Figure 3M:
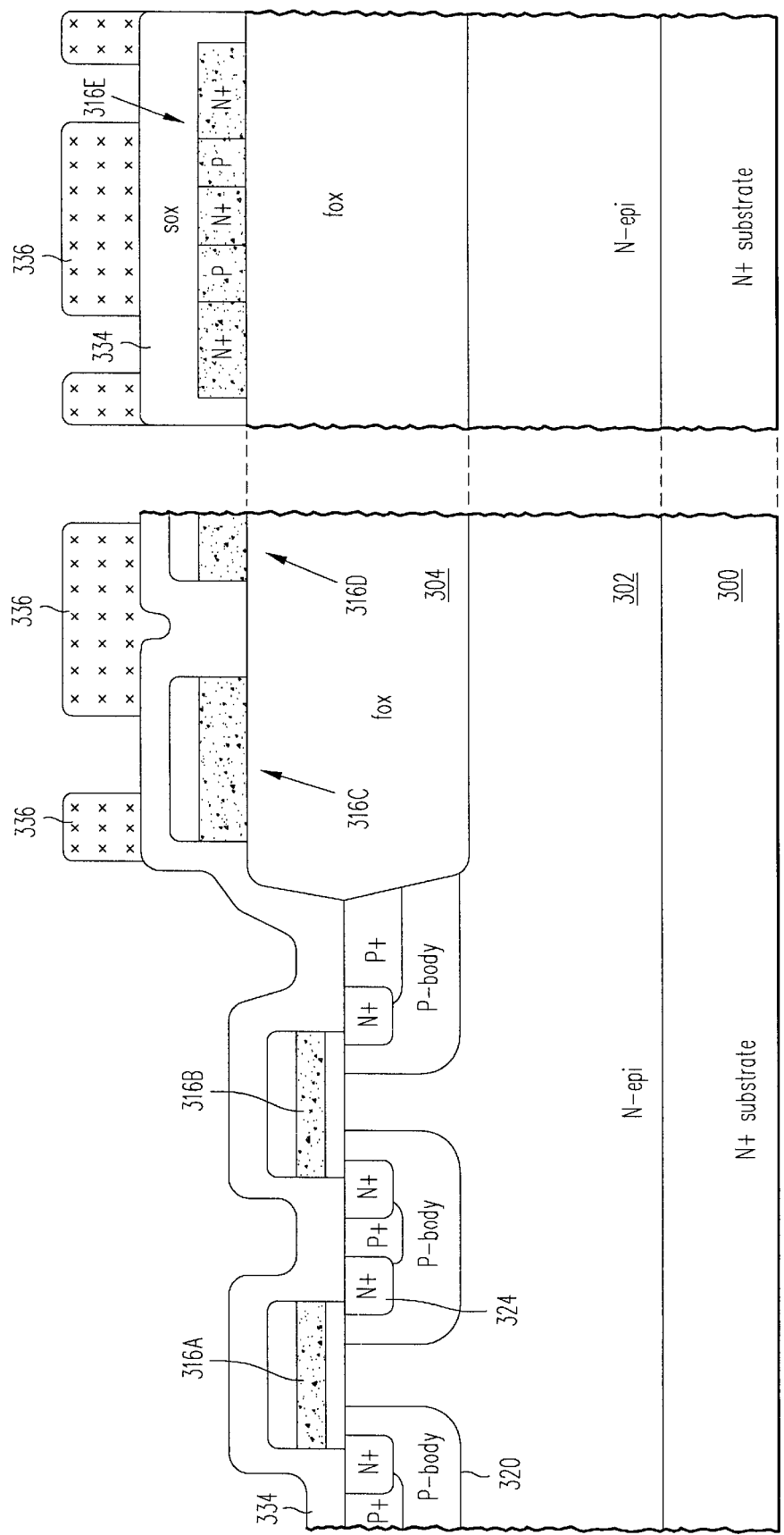
Figure 3N:
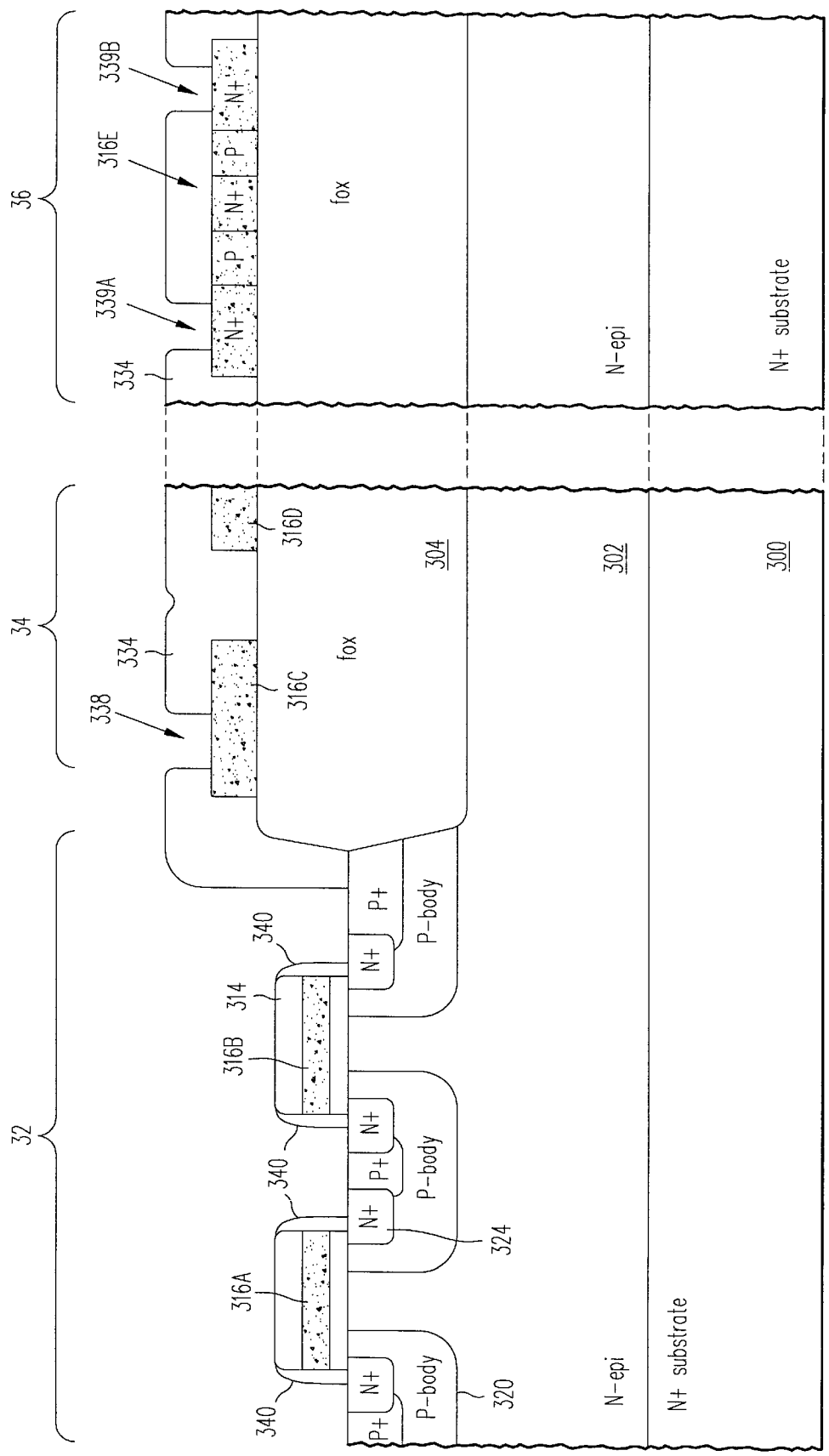
Figure 30:
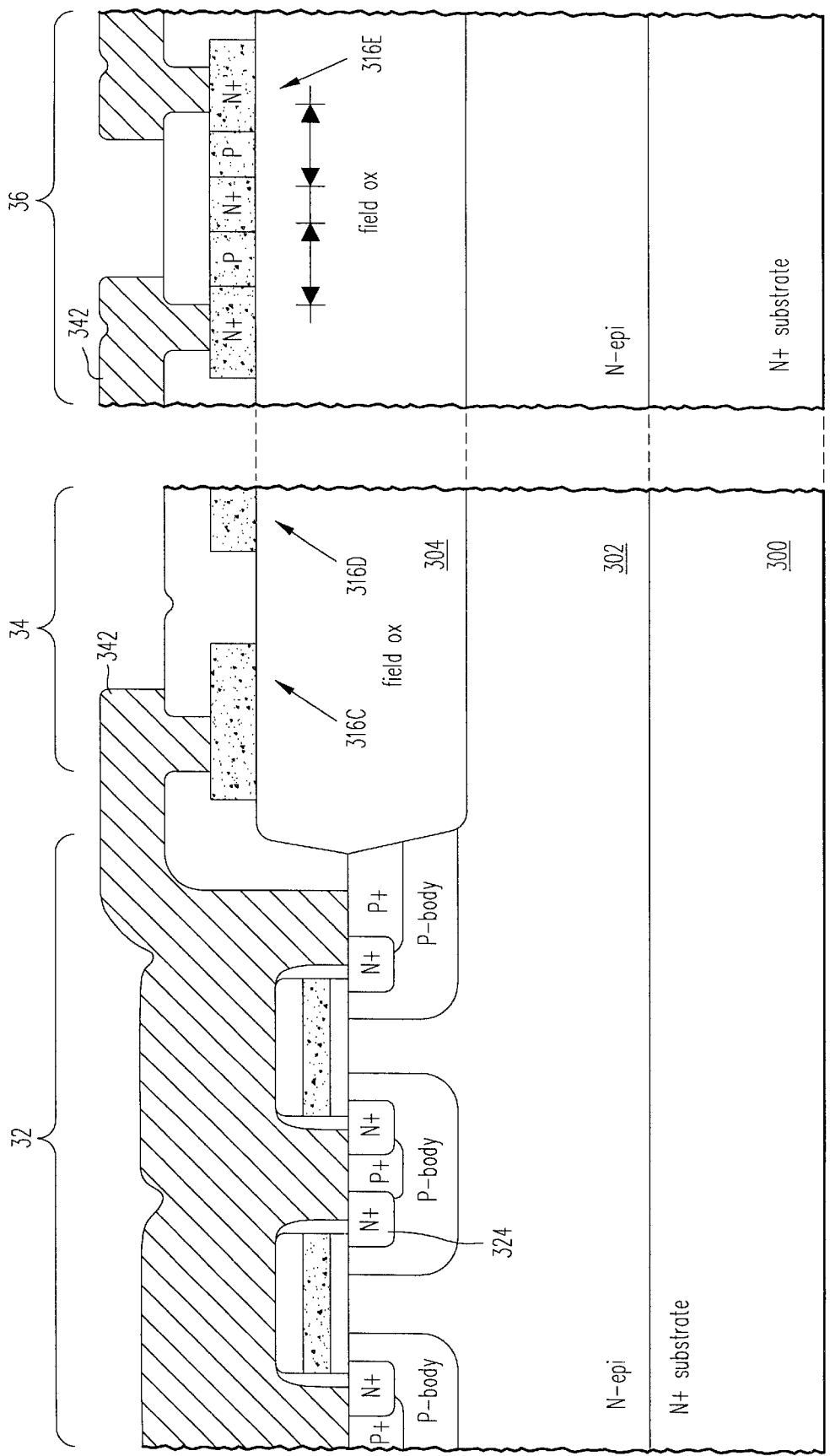

As shown in FIG. 3M, a photoresist layer 336 is deposited on spacer layer 334 over the termination area 34 and diode area 36. In termination area 34 a hole is formed over the source plate 316C. In the diode area 36, two holes are formed in photoresist layer 336 over the ends of the diode section 316E. Spacer layer 334 is then etched with a directional, vertical etch which removes all of the spacer layer 334 from the flat surfaces but leaves spacers 340 on the sides of gate sections 316A and 316B. A contact hole 338 is also opened to the source plate 316C, and contact holes 339A and 339B are formed to the ends of the diode section 316E. The resulting structure is shown in FIG. 3N.

As shown in FIG. 3O, a metal layer 342 is then deposited, masked and etched. Metal layer 342 makes contact with the N+ source regions 324 and the P+ body-contact regions 333, but metal layer 342 is prevented from shorting to the gate sections 316A and 316B by the spacers 340 and the polysilicon oxide layer 314. Metal layer 342 also contacts the source plate 316C, which extends to a source contact pad somewhere on the chip. When the chip is sawed to separate it from other chips in the wafer, the sawing process takes place in the region of drain plate 316D and causes drain plate 316D to be shorted to the N+ substrate 302, which forms the drain of the MOSFET.

In the diode area 36, metal layer 342 extends into holes 339A and 339B and makes contact with the ends of the diode section 316E, thereby creating a series arrangement of two forward-biased and two reverse-biased diodes. Using the metal layer 342, one end of the diode section 316E is connected to the source regions 324 and the other end is connected to the gate pad (not shown). Thus, when all the connections are made the diodes are connected between the source regions and the gate and can perform the protective function described in the above referenced application Ser. No. 09/001,768 and application Ser. No. 09/293,380, filed Apr. 16, 1999.

Figure 4A:
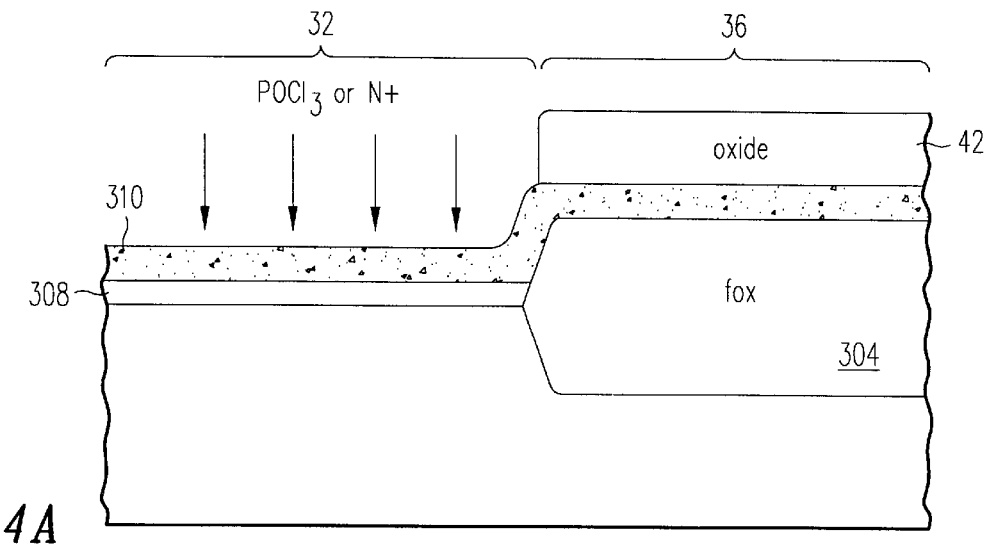
FIGS. 4A–4C show an alternative process for forming the thick polysilicon oxide layer over the active area of the MOSFET
Figure 4B:
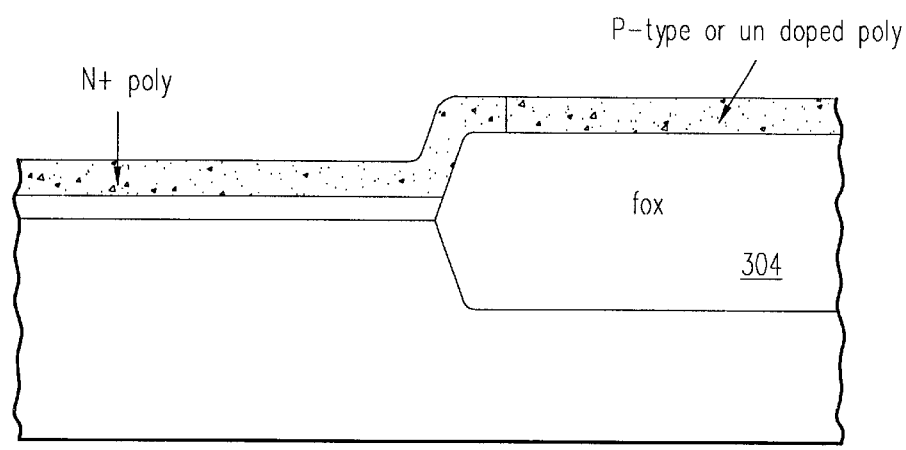
Figure 4C:
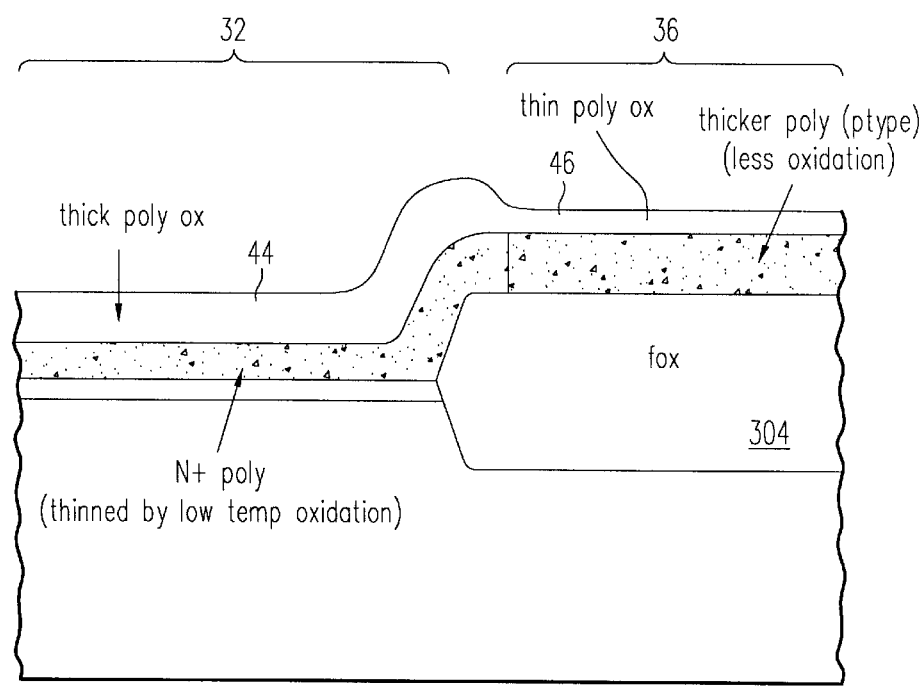

FIGS. 4A–4C illustrate an alternative to the polysilicon LOCOS process for forming the thick polysilicon oxide layer in the active area 32 and the thin polysilicon oxide layer in the diode area 36. diode (compare FIG. 3F). Instead of depositing a nitride layer, an oxide layer 42 is deposited or grown on polysilicon layer 310. Oxide layer 42 is then masked and etched from the active area 32, as shown in FIG. 4A. POCl$_3$ or N+ is implanted into the active area 32, using oxide layer 42 as a mask which prevents the dopant from entering the diode area 36. Oxide layer 42 is stripped (FIG. 4B), and the substrate is oxidized in a wet atmosphere at from 850° to 950° C. for 1 hour to 4 hours. Since oxide grows more rapidly in heavily doped-polysilicon than in lightly-doped polysilicon, a thick polysilicon oxide layer 44 forms in the active area 32 and a thin polysilicon oxide layer forms in the diode area 36. From this point the process continues as shown in FIG. 3G et seq.

Figure 5:
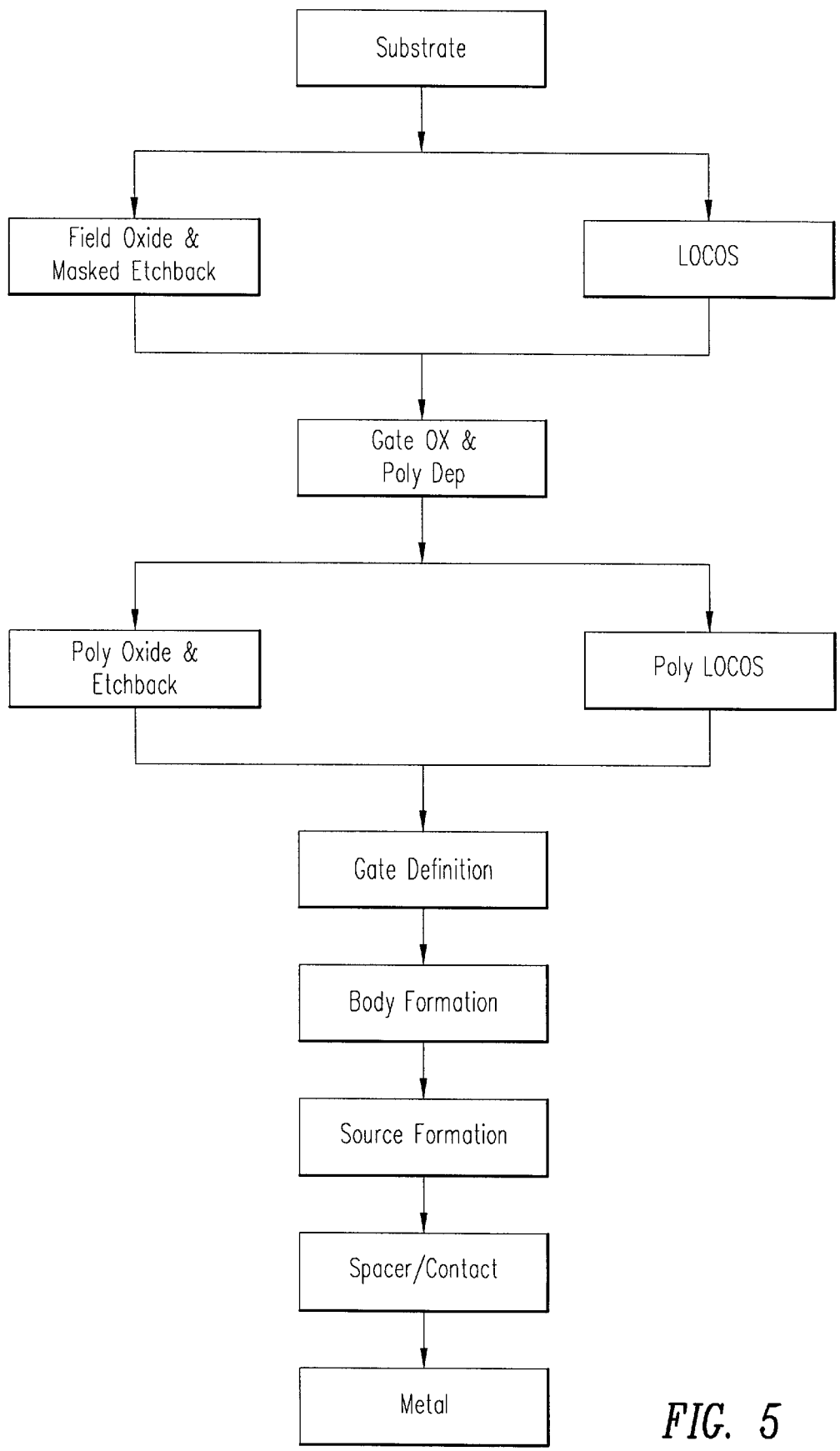
FIG. 5 is a flowchart summarizing the process sequences shown in FIGS. 3A–3O and 4A–4C.

FIG. 5 is a flowchart which illustrates the processes described in FIGS. 3A–3O and FIGS. 4A–4C. Alternatives are shown for the step illustrated at FIGS. 3B–3C where the field oxide region can be formed either by means of a LOCOS process or by depositing and etching back an oxide layer, and for the step illustrated at FIGS. 3F and 4C where the thick and thin polysilicon oxide layers can be formed either by a polysilicon LOCOS process or by using the differential growth rates of polysilicon oxide in heavily and lightly doped polysilicon.

Figure 6:
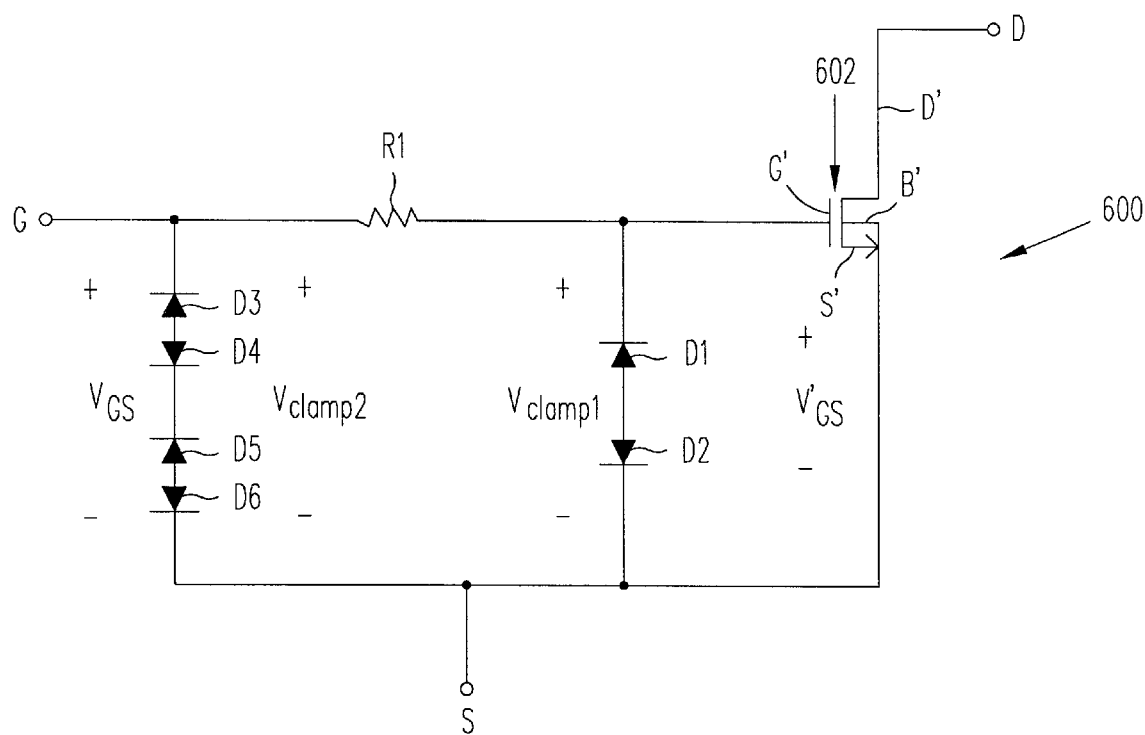
FIG. 6 is a schematic circuit diagram of a voltage clamping arrangement to protect the gate oxide layer of a MOSFET.

The above-referenced application Ser. No. 09/001,768, now abandoned, and application Ser. No. 09/306,003, filed May 5, 1999, now U.S. Pat. No. 6,172,383, issued Jan. 9, 2001, describe several embodiments of voltage clamping arrangements that can be used to protect the gate oxide layer from ESD pulses and other excessive voltages. FIG. 6 is a schematic circuit diagram of an illustrative arrangement which includes an inner voltage clamp $V_{clamp1}$ and an outer voltage clamp $V_{clamp2}$ used to protect the gate oxide layer 602 of an N-channel MOSFET 600. MOSFET 600 has a gate G', a drain D', a body B' and a source S'. Connections to the gate G', drain D' and source S' are made through a gate terminal G, a drain terminal D and a source terminal S, respectively. $V'_{GS}$ represents the voltage between the gate G' and the source S'; $V_{GS}$ represents the voltage between the gate terminal G and the source terminal S.

Voltage clamp $V_{clamp1}$ contains diodes D1 and D2 which are connected in series anode-to-anode between source S' (which is shorted to source terminal S) and gate G'. Voltage clamp $V_{clamp2}$ contains diodes D3, D4, D5 and D6 which are connected in pairs in series anode-to-anode between source terminal S and gate terminal G. A current-limiting resistor R1 is connected between gate G' and gate terminal G.

As $V_{GS}$ rises, voltage clamp $V_{clamp1}$ breaks down at a voltage equal to the breakdown voltage of diode D1 plus the forward voltage drop across diode D2, clamping $V'_{GS}$ at that level. Resistor R1 limits the current and thereby prevents diodes D1 and D2 from burning out. As $V_{GS}$ continues to rise, voltage clamp $V_{clamp2}$ breaks down at a voltage equal to the sum of the breakdown voltages of diodes D3 and D5 and the forward voltage drops across diodes D4 and D6, shunting the current around diodes D1 and D2.

FIG. 6 represents a general structure. Typically the voltage at which voltage clamp $V_{clamp2}$ breaks down is greater than the voltage at which voltage clamp $V_{clamp1}$ breaks down. The respective breakdown voltages and forward voltage drops of the diodes are set at levels required to achieve the desired clamping characteristics. In some embodiments voltage clamp $V_{clamp2}$ and/or resistor R1 can be omitted. The number of diodes within voltage clamps $V_{clamp1}$ and $V_{clamp2}$ can vary, as can the polarities of the diodes within each voltage clamp. Each voltage clamp may contain parallel diode arrangements to provide different clamping voltages depending on whether $V_{GS}$ is increasing or decreasing.

Figure 7A:
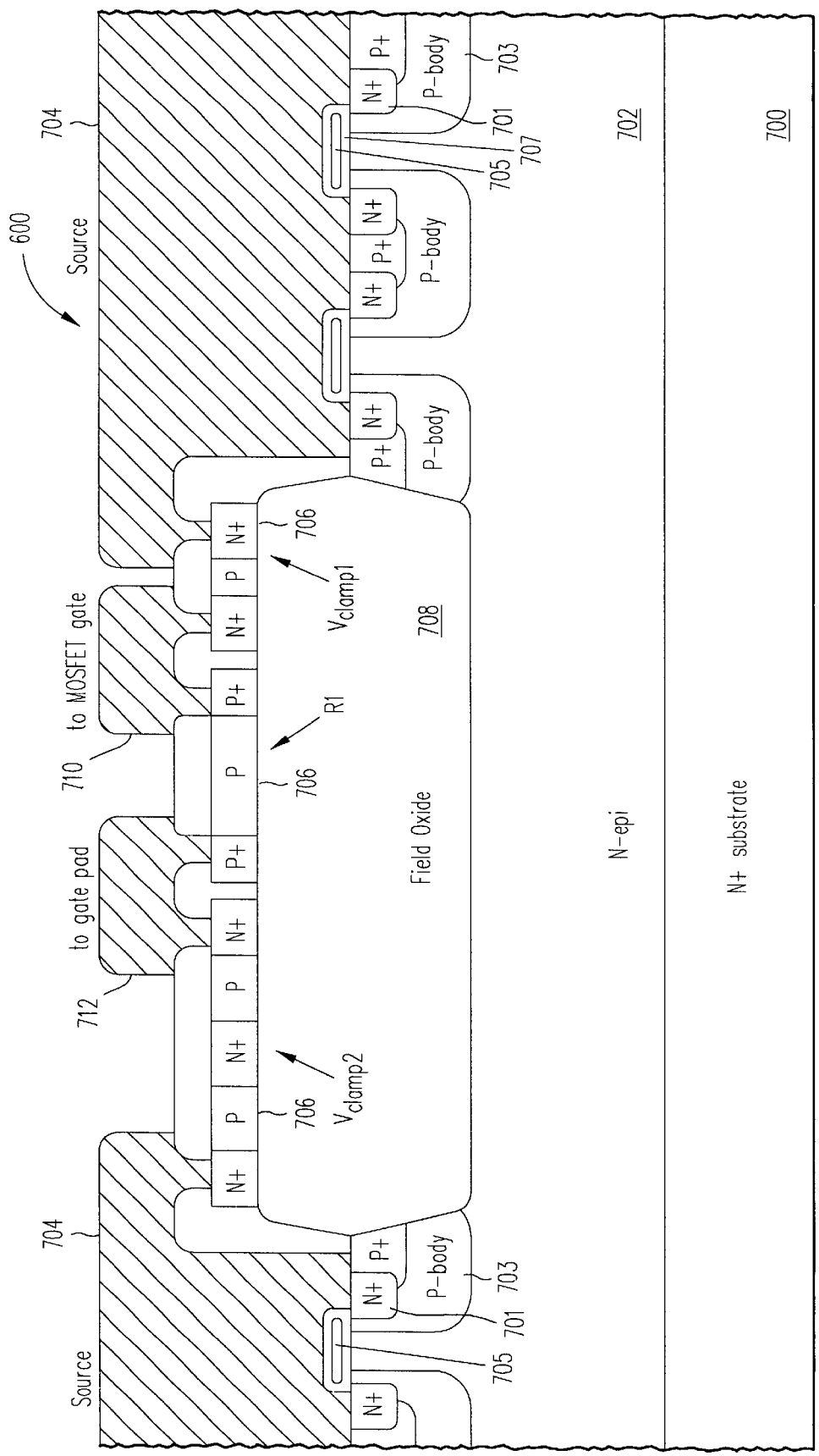
FIGS. 7A and 7B are cross-sectional and top views, respectively of the gate voltage clamped MOSFET shown in FIG. 6.

FIG. 7A is a cross-sectional view of MOSFET 600 fabricated in accordance with the techniques of this invention. MOSFET 600 is shown as an N-channel DMOSFET having a gate 705 and a gate oxide layer 707. The N+ source regions 701 and P-body regions 703 of MOSFET 600 are formed in an N-epi layer 702 which overlies an N+ substrate 700 and are contacted by a source metal layer 704. The diodes in voltage clamps $V_{clamp1}$ and $V_{clamp2}$ and the resistor R1 are formed as previously described in a polysilicon layer 706 which overlies a field oxide region 708, each diode consisting of a series of P and N+ regions in polysilicon layer 706. Resistor R1 includes a P region between two P+ regions.

Source metal layer 704 contacts one end of voltage clamp $V_{clamp1}$ and one end of voltage clamp $V_{clamp2}$. The other end of voltage clamp $V_{clamp1}$ is connected via a metal layer 710 to one end of resistor R1 and to the gate terminal G. The other end of voltage clamp $V_{clamp2}$ is connected via a metal layer 712 to the other end of resistor R1 and to the gate G'. (See FIG. 6.)

Figure 7B:
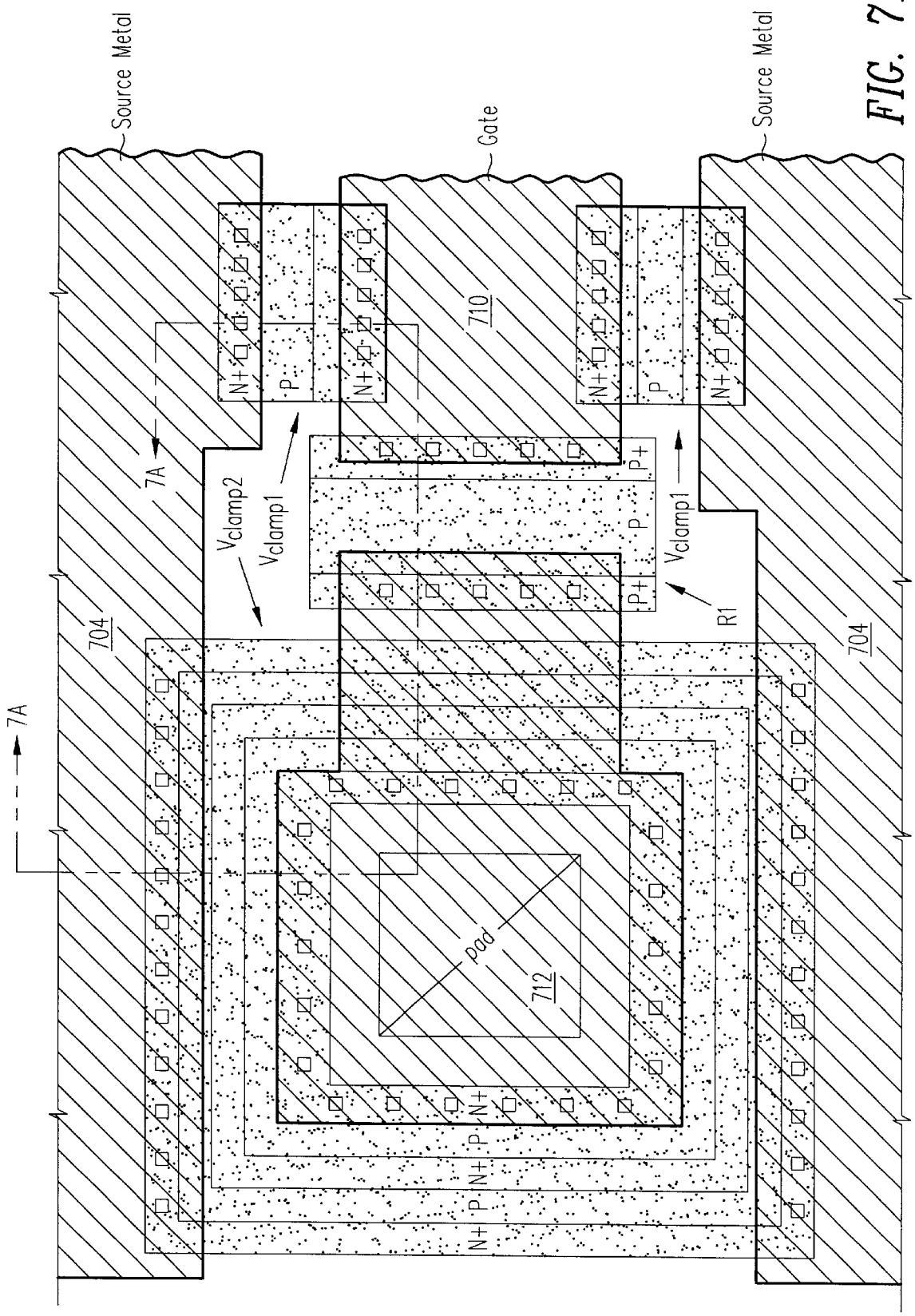

FIG. 7B shows a top view of MOSFET 600, with the cross-section at which FIG. 7A is taken shown as the line 7A—7A (which is not linear and is broken).

The foregoing embodiments are intended to be illustrative and not limiting of the broad principles of this invention. Many additional embodiments will be apparent to persons skilled in the art.

We claim:

1. A method of forming a gate voltage-clamped vertical MOSFET device comprising:

providing a semiconductor body, said MOSFET device including an active area where a MOSFET is to be formed and a diode area where a gate voltage claimping diode is to be formed;

forming a gate oxide layer on a surface of said semiconductor body;

forming a polysilicon layer on said gate oxide layer in said active area, said polysilicon layer extending into said diode area;

forming a first mask over said polysilicon layer, said first mask defining a gate section of said polysilicon layer in said active area and a diode section of said polysilicon layer in said diode area;

removing a portion of the polysilicon layer through said first mask to form said gate section and said diode section of said polysilicon layer; and implanting a first dopant of a first conductivity type into said semiconductor body and into said diode section to form a first region of said MOSFET and a first region of said diode.

2. The method of claim 1 wherein said first region of said MOSFET comprises a body region.

3. The method of claim 2 wherein said first region of said diode comprises an anode.

4. The method of claim 1 comprising in addition implanting a second dopant of a second conductivity type into said semiconductor body and into said diode section to form a second region of said MOSFET and a second region of said diode.

5. The method of claim 4 wherein said second region of said MOSFET comprises a source region.

6. The method of claim 5 wherein said second region of said diode comprises a cathode.

7. The method of claim 1 comprising forming a field oxide region on said semiconductor body prior to forming said polysilicon layer.

8. The method of claim 7 wherein forming said field oxide region comprises performing a LOCOS process.

9. The method of claim 7 wherein forming said field oxide region comprises forming an oxide layer and removing a portion of said oxide layer.

10. The method of claim 1 comprising forming a nitride layer over said diode section and implanting a third dopant into said polysilicon layer in said active area, said nitride layer preventing said third dopant from entering said polysilicon layer in said diode area.

11. The method of claim 1 comprising depositing a spacer layer and etching said spacer layer to form a sidewall of said gate section.

12. The method of claim 11 comprising depositing a metal layer to make contact with a source region of said MOSFET.

13. A method of forming a gate voltage-clamped vertical MOSFET device comprising:

provided a semiconductor body, said MOSFET device including an active area where a MOSFET is to be formed and a diode area where a gate voltage clamping diode is to be formed;

forming a field oxide region in said diode area;

forming a gate oxide layer on surface of said silicon body in said active area;

depositing a polysilicon layer on said field oxide layer and said gate oxide layer;

implanting a first dopant into said polysilicon layer in said active area;

forming a first mask over said polysilicon layer, said first mask defining a gate section of said polysilicon layer in said active area and a diode section of said polysilicon layer in said diode area;

removing a portion of the polysilicon layer through said first mask to form said gate section and said diode section of said polysilicon layer;

implanting a second dopant into said active and diode areas to form a body region in said active area and an anode in said diode section; and implanting a third dopant into said active and diode areas to form a source region in said active area and a cathode in said diode section.

14. The method of claim 13 comprising depositing a silicon dioxide spacer layer over said gate and diode sections and etching said spacer layer to form a sidewall of said gate section.

* * * * *